United States Patent
Inoue

(10) Patent No.: US 12,166,056 B2
(45) Date of Patent: Dec. 10, 2024

(54) PHOTOELECTRIC CONVERSION ELEMENT AND PHOTOELECTRIC CONVERSION DEVICE

(71) Applicant: SONY SEMICONDUCTOR SOLUTIONS CORPORATION, Kanagawa (JP)

(72) Inventor: Kouichi Inoue, Kumamoto (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 294 days.

(21) Appl. No.: 17/623,951

(22) PCT Filed: Apr. 3, 2020

(86) PCT No.: PCT/JP2020/015309
§ 371 (c)(1),
(2) Date: Dec. 30, 2021

(87) PCT Pub. No.: WO2021/005851
PCT Pub. Date: Jan. 14, 2021

(65) Prior Publication Data
US 2022/0367551 A1  Nov. 17, 2022

(30) Foreign Application Priority Data
Jul. 11, 2019  (JP) ................. 2019-129024

(51) Int. Cl.
*H01L 27/146* (2006.01)
*H10K 30/87* (2023.01)
*H10K 39/32* (2023.01)

(52) U.S. Cl.
CPC .. *H01L 27/14629* (2013.01); *H01L 27/14621* (2013.01); *H01L 27/14625* (2013.01); *H01L 27/14627* (2013.01); *H10K 39/32* (2023.02)

(58) Field of Classification Search
CPC . H01L 27/146–14652; H01L 27/14683; H01L 27/14689; H01L 27/14629; H01L 27/14625; H10K 39/32
See application file for complete search history.

(56) References Cited

U.S. PATENT DOCUMENTS

2007/0228503 A1  10/2007  Yokoyama
2011/0242376 A1  10/2011  Ando
(Continued)

FOREIGN PATENT DOCUMENTS

CN  102214667 A  10/2011
CN  103000644 A  3/2013
(Continued)

OTHER PUBLICATIONS

International Search Report and Written Opinion of PCT Application No. PCT/JP2020/015309, issued on Jun. 30, 2020, 13 pages of ISRWO.

*Primary Examiner* — Sonya McCall-Shepard
(74) *Attorney, Agent, or Firm* — CHIP LAW GROUP

(57) ABSTRACT

Reflected light from a back-illuminated photoelectric conversion element is to be reduced. The photoelectric conversion element includes an on-chip lens, a substrate, a front-surface-side reflective film, and a back-surface-side reflective film. The on-chip lens condenses incident light. A photoelectric conversion unit that performs photoelectric conversion on the condensed incident light is disposed in the substrate, and the back surface side of the substrate is irradiated with the condensed incident light. The front-surface-side reflective film is disposed on the front surface side that is a different side from the back surface side of the substrate, and reflects transmitted light that is the incident light having passed through the photoelectric conversion unit. The back-surface-side reflective film is disposed on the back surface side of the substrate, has an opening of sub-
(Continued)

stantially the same size as the condensing size of the condensed incident light, and further reflects the reflected transmitted light.

27 Claims, 26 Drawing Sheets

(56) References Cited

U.S. PATENT DOCUMENTS

| | | |
|---|---|---|
| 2012/0050554 A1 | 3/2012 | Levine et al. |
| 2012/0313205 A1 | 12/2012 | Haddad et al. |
| 2013/0069130 A1 | 3/2013 | Kakehi |
| 2013/0070131 A1 | 3/2013 | Ohkabu et al. |
| 2014/0145287 A1 | 5/2014 | Kato |
| 2017/0287962 A1 | 10/2017 | Ootsuka |
| 2018/0006072 A1 | 1/2018 | Roy et al. |
| 2018/0160058 A1 | 6/2018 | Nakata |
| 2019/0067357 A1 | 2/2019 | Cheng et al. |
| 2019/0198541 A1 | 6/2019 | Shinohara |
| 2019/0244992 A1 | 8/2019 | Yokogawa et al. |

FOREIGN PATENT DOCUMENTS

| | | |
|---|---|---|
| CN | 103765590 A | 4/2014 |
| CN | 106796942 A | 5/2017 |
| CN | 109427835 A | 3/2019 |
| CN | 109906512 A | 6/2019 |
| CN | 110291635 A | 9/2019 |
| DE | 102018107914 A1 | 2/2019 |
| EP | 2372769 A2 | 10/2011 |
| JP | 2005-116939 A | 4/2005 |
| JP | 2007-093668 A | 4/2007 |
| JP | 2007-273894 A | 10/2007 |
| JP | 2007-335905 A | 12/2007 |
| JP | 2009-260134 A | 11/2009 |
| JP | 2011-216826 A | 10/2011 |
| JP | 2013-055159 A | 3/2013 |
| JP | 2013-065688 A | 4/2013 |
| JP | 2013-069718 A | 4/2013 |
| JP | 2017-059739 A | 3/2017 |
| JP | 2019-114642 A | 7/2019 |
| JP | 2019-114728 A | 7/2019 |
| KR | 10-2019-0024645 A | 3/2019 |
| KR | 10-2019-0067179 A | 6/2019 |
| TW | 201914046 A | 4/2019 |
| WO | 2013/031707 A1 | 3/2013 |
| WO | 2016/052249 A1 | 4/2016 |
| WO | 2017/047039 A1 | 3/2017 |
| WO | 2018/079296 A1 | 5/2018 |
| WO | 2019/130820 A1 | 7/2019 |
| WO | 2019/131122 A1 | 7/2019 |

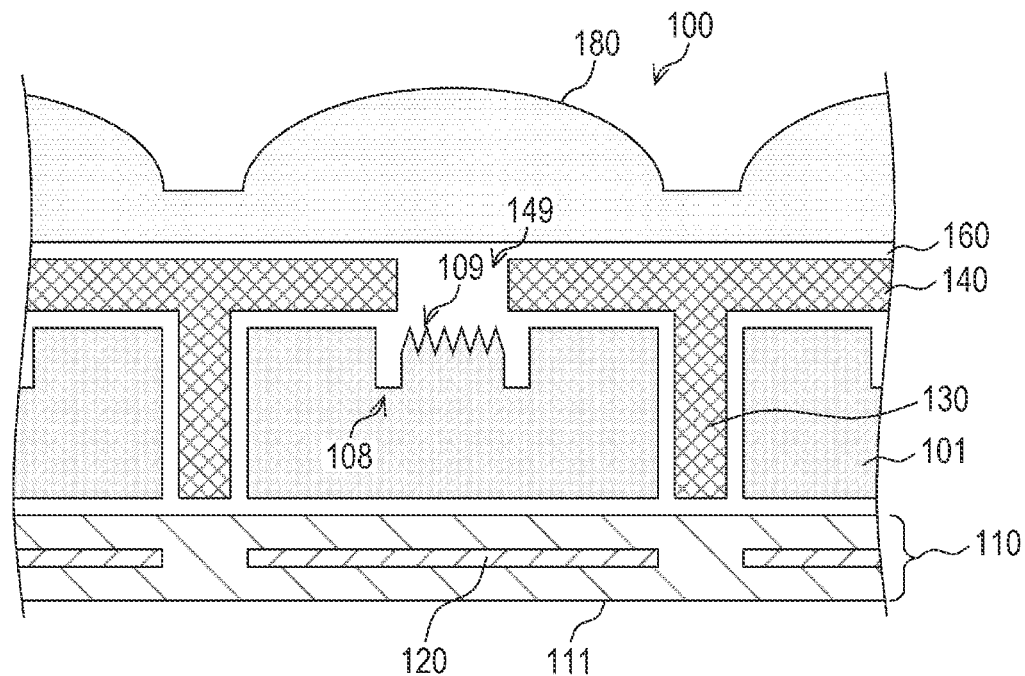
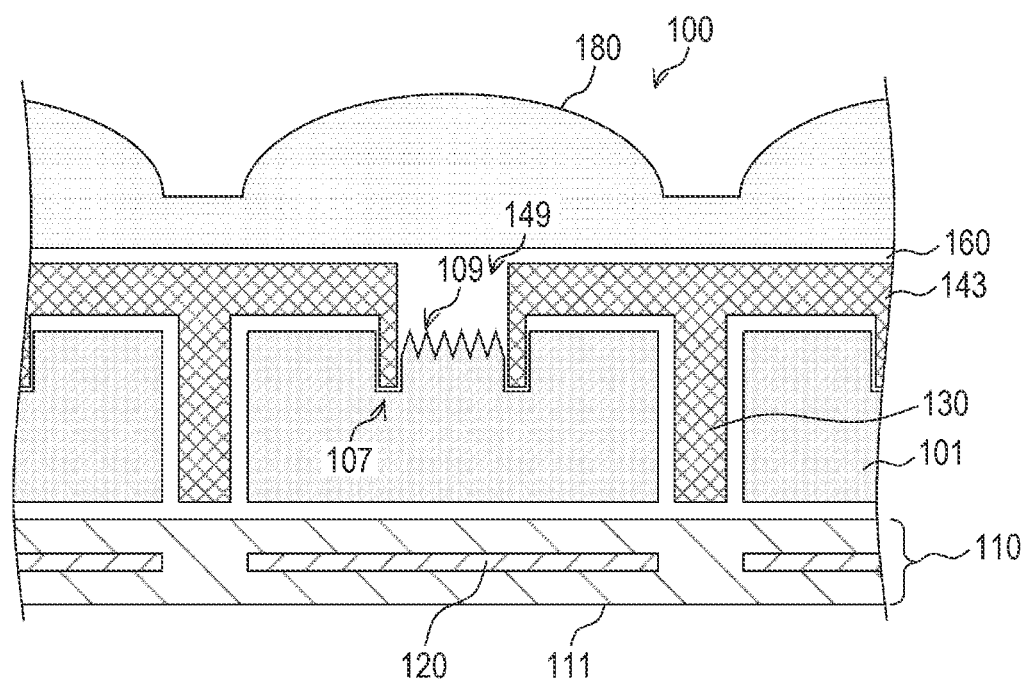

PHOTOELECTRIC CONVERSION ELEMENT AND PHOTOELECTRIC CONVERSION DEVICE

CROSS REFERENCE TO RELATED APPLICATIONS

This application is a U.S. National Phase of International Patent Application No. PCT/JP2020/015309 filed on Apr. 3, 2020, which claims priority benefit of Japanese Patent Application No. JP 2019-129024 filed in the Japan Patent Office on Jul. 11, 2019. Each of the above-referenced applications is hereby incorporated herein by reference in its entirety.

TECHNICAL FIELD

The present disclosure relates to photoelectric conversion elements and photoelectric conversion devices. More particularly, the present disclosure relates to a photoelectric conversion element irradiated with incident light from the back surface of a semiconductor substrate, and a photoelectric conversion device using the photoelectric conversion element.

BACKGROUND ART

Imaging devices in which incident light is emitted onto the back surface side of a semiconductor substrate have been conventionally used. Photoelectric conversion units such as photodiodes that photoelectrically convert incident light are formed in the semiconductor substrate. As incident light is emitted onto the photoelectric conversion units without passing through the wiring region formed on the front surface of the semiconductor substrate, sensitivity can be improved.

As such an imaging device, for example, an imaging device in which a photodiode or the like is formed in a silicon layer of a silicon-on-insulator (SOI) substrate formed by sequentially stacking an intermediate layer and the silicon layer on a silicon substrate is used (see Patent Document 1, for example). In this imaging device, a wiring portion (wiring region) is formed on the front surface of the silicon layer in which a light receiving sensor unit such as a photodiode is formed. After a support substrate is bonded to the wiring region, the silicon substrate and the intermediate layer are removed. A silicon thin film having a thickness of 10 μm or smaller can be used as the silicon layer. As the step of thinning the semiconductor substrate by grinding or the like is unnecessary, silicon layers having a stable thickness can be manufactured with a high yield.

CITATION LIST

Patent Document

Patent Document 1: Japanese Patent Application Laid-Open No. 2007-335905

SUMMARY OF THE INVENTION

Problems to be Solved by the Invention

With the conventional technique described above, there is the problem of a large amount of reflected light from an imaging device. Since a thin silicon layer is used as the semiconductor substrate in which a photodiode or the like is formed, incident light that has not been absorbed by the semiconductor substrate reaches the wiring region and is reflected, resulting in a large amount of reflected light. When this reflected light enters the imaging device again, flare or the like occurs, and image quality is degraded.

The present disclosure is made in view of the above problems, and aims to reduce reflected light from a back-illuminated imaging device.

Solutions to Problems

The present disclosure is made to solve the above problems, and a first aspect thereof is a photoelectric conversion element that includes: an on-chip lens that condenses incident light; a substrate in which a photoelectric conversion unit that performs photoelectric conversion on the condensed incident light is disposed, the back surface side of the substrate being irradiated with the condensed incident light; a front-surface-side reflective film that is disposed on the front surface side of the substrate and reflects transmitted light, the front surface side being a different side from the back surface side of the substrate, the transmitted light being the incident light having passed through the photoelectric conversion unit; and a back-surface-side reflective film that is disposed on the back surface side of the substrate, has an opening of substantially the same size as the condensing size of the condensed incident light, and further reflects the reflected transmitted light.

Also, in the first aspect, in the back-surface-side reflective film, the opening area of the opening on the side of the on-chip lens may differ from the opening area of the opening on the side of the substrate.

Further, in the first aspect, the back-surface-side reflective film may have the opening formed in a tapered shape.

Also, in the first aspect, the photoelectric conversion element may further include a substrate-back-surface scattering portion that is formed in the back surface of the substrate and scatters the condensed incident light.

Further, in the first aspect, the substrate-back-surface scattering portion may be formed with irregularities formed near the opening of the back-surface-side reflective film.

Also, in the first aspect, the photoelectric conversion element may further include a substrate reflective portion that is formed in the back surface of the substrate near the edge of the back-surface-side reflective film in the opening and reflects the reflected transmitted light.

Further, in the first aspect, the substrate reflective portion may be formed with a groove formed in the back surface of the substrate.

Further, in the first aspect, the substrate reflective portion may be formed with metal buried in a groove formed in the back surface of the substrate.

Also, in the first aspect, the photoelectric conversion element may further include a substrate-front-surface scattering portion that is formed near the front surface side of the substrate and scatters the reflected transmitted light.

Further, in the first aspect, the substrate-front-surface scattering portion may be formed in the front-surface-side reflective film.

Also, in the first aspect, the substrate-front-surface scattering portion may be formed with irregularities formed in the front-surface-side reflective film.

Further, in the first aspect, the substrate-front-surface scattering portion may be formed in the front surface of the substrate.

Also, in the first aspect, the substrate-front-surface scattering portion may be formed with irregularities formed in the front surface of the substrate.

Further, in the first aspect, the front-surface-side reflective film may be formed at the same time as a wiring line that transmits a signal of the photoelectric conversion unit.

Also, in the first aspect, the front-surface-side reflective film may be formed with an electrode that applies a signal to the photoelectric conversion unit.

Further, in the first aspect, the front-surface-side reflective film may include a reflection adjustment portion that adjusts reflection of the transmitted light.

Also, in the first aspect, the reflection adjustment portion may be formed with an opening formed in the front-surface-side reflective film.

Further, in the first aspect, the reflection adjustment portion may be formed with a thin film portion formed in the front-surface-side reflective film.

Also, in the first aspect, the photoelectric conversion element may include a plurality of pixels each including the on-chip lens, the substrate, the front-surface-side reflective film, and the back-surface-side reflective film.

Also, in the first aspect, the pixel may further include a color filter that transmits incident light of a predetermined wavelength in the incident light.

Further, in the first aspect, the color filter may transmit the incident light of a long wavelength.

Also, in the first aspect, the back-surface-side reflective film may be designed to have the position of the opening shifted in accordance with the incident angle of the incident light entering the pixel.

Further, in the first aspect, the back-surface-side reflective film may have a shape in which the opening is extended in accordance with the incident angle of the incident light entering the pixel.

Also, in the first aspect, the photoelectric conversion element may further include an absorption film that is disposed between the on-chip lens and the back-surface-side reflective film and absorbs the reflected transmitted light.

Further, in the first aspect, the substrate may be formed with a semiconductor substrate, and the photoelectric conversion unit may be formed with a semiconductor element.

Also, in the first aspect, the photoelectric conversion unit may be formed with an organic photoelectric conversion film.

Further, a second aspect of the present disclosure is a photoelectric conversion device that includes: an on-chip lens that condenses incident light; a substrate in which a photoelectric conversion unit that performs photoelectric conversion on the condensed incident light is disposed, a back surface side of the substrate being irradiated with the condensed incident light; a front-surface-side reflective film that is disposed on a front surface side of the substrate and reflects transmitted light, the front surface side being a different side from the back surface side of the substrate, the transmitted light being the incident light having passed through the photoelectric conversion unit; a back-surface-side reflective film that is disposed on the back surface side of the substrate, has an opening of substantially the same size as a condensing size of the condensed incident light, and further reflects the reflected transmitted light; and a processing circuit that processes a signal generated by the photoelectric conversion unit.

As the aspects described above are adopted, incident light that has passed through the semiconductor substrate can be effectively reflected in the direction of the semiconductor substrate while the incident light to be condensed is transmitted in the semiconductor substrate.

BRIEF DESCRIPTION OF DRAWINGS

FIGS. 9A and 9B are cross-sectional diagrams showing example configurations of pixels according to a fourth embodiment of the present disclosure.

MODES FOR CARRYING OUT THE INVENTION

Figure 1:
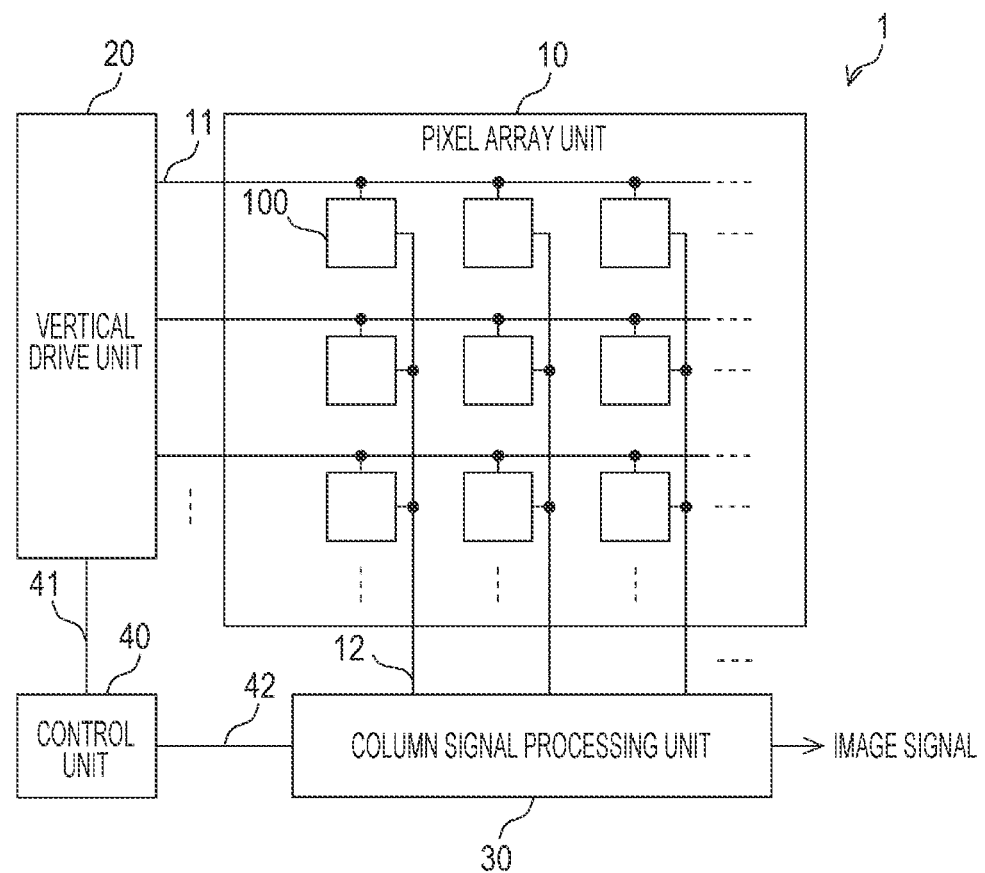
FIG. 1 is a diagram showing an example configuration of an imaging device according to an embodiment of the present disclosure.

Next, modes for carrying out the present disclosure (the modes will be hereinafter referred to as embodiments) are described with reference to the drawings. In the drawings mentioned below, the same or similar components are denoted by the same or similar reference numerals. Further, explanation of the embodiments will be made in the following order.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment
10. Tenth Embodiment
11. Eleventh Embodiment
12. Twelfth Embodiment
13. Example application to a camera

1. First Embodiment

[Configuration of an Imaging Device]

FIG. 1 is a diagram showing an example configuration of an imaging device according to an embodiment of the present disclosure. An imaging device 1 in this drawing includes a pixel array unit 10, a vertical drive unit 20, a column signal processing unit 30, and a control unit 40.

The pixel array unit 10 is formed with pixels 100 arranged in a two-dimensional grid pattern. Here, a pixel 100 generates an image signal in accordance with emitted light. This pixel 100 includes a photoelectric conversion unit that generates electric charges in accordance with the emitted light. The pixel 100 further includes a pixel circuit. This pixel circuit generates an image signal based on the electric charges generated by the photoelectric conversion unit. The generation of the image signal is controlled by a control signal generated by the vertical drive unit 20 described later. In the pixel array unit 10, signal lines 11 and 12 are arranged in an X-Y matrix. The signal lines 11 are signal lines that transmit control signals for the pixel circuits in the pixels 100, are provided for the respective rows in the pixel array unit 10, and are designed to be shared by the pixels 100 aligned in each row. The signal lines 12 are signal lines that transmit image signals generated by the pixel circuits of the pixels 100, are provided for the respective columns in the pixel array unit 10, and are designed to be shared by the pixels 100 aligned in each column. These photoelectric conversion units and pixel circuits are formed in a semiconductor substrate.

The vertical drive unit 20 generates control signals for the pixel circuits of the pixels 100. This vertical drive unit 20 transmits the generated control signals to the pixels 100 via the signal lines 11 in the drawing. The column signal processing unit 30 processes image signals generated by the pixels 100. This column signal processing unit 30 processes the image signals transmitted from the pixels 100 via the signal lines 12 in the drawing. The processing at the column signal processing unit 30 corresponds to analog-to-digital conversion for converting analog image signals generated in the pixels 100 into digital image signals, for example. The image signals processed by the column signal processing unit 30 are output as image signals of the imaging device 1. The control unit 40 controls the entire imaging device 1. This control unit 40 generates and outputs control signals for controlling the vertical drive unit 20 and the column signal processing unit 30, to control the imaging device 1. The control signals generated by the control unit 40 are transmitted to the vertical drive unit 20 and the column signal processing unit 30 through signal lines 41 and 42, respectively.

Note that the imaging device 1 in the drawing is an example of the imaging apparatus disclosed in the claims. The pixel array unit 10 in the drawing is an example of the imaging device described in the claims. The column signal processing unit 30 in the drawing is an example of the processing circuit described in the claims.

[Configuration of a Pixel]

Figure 2:
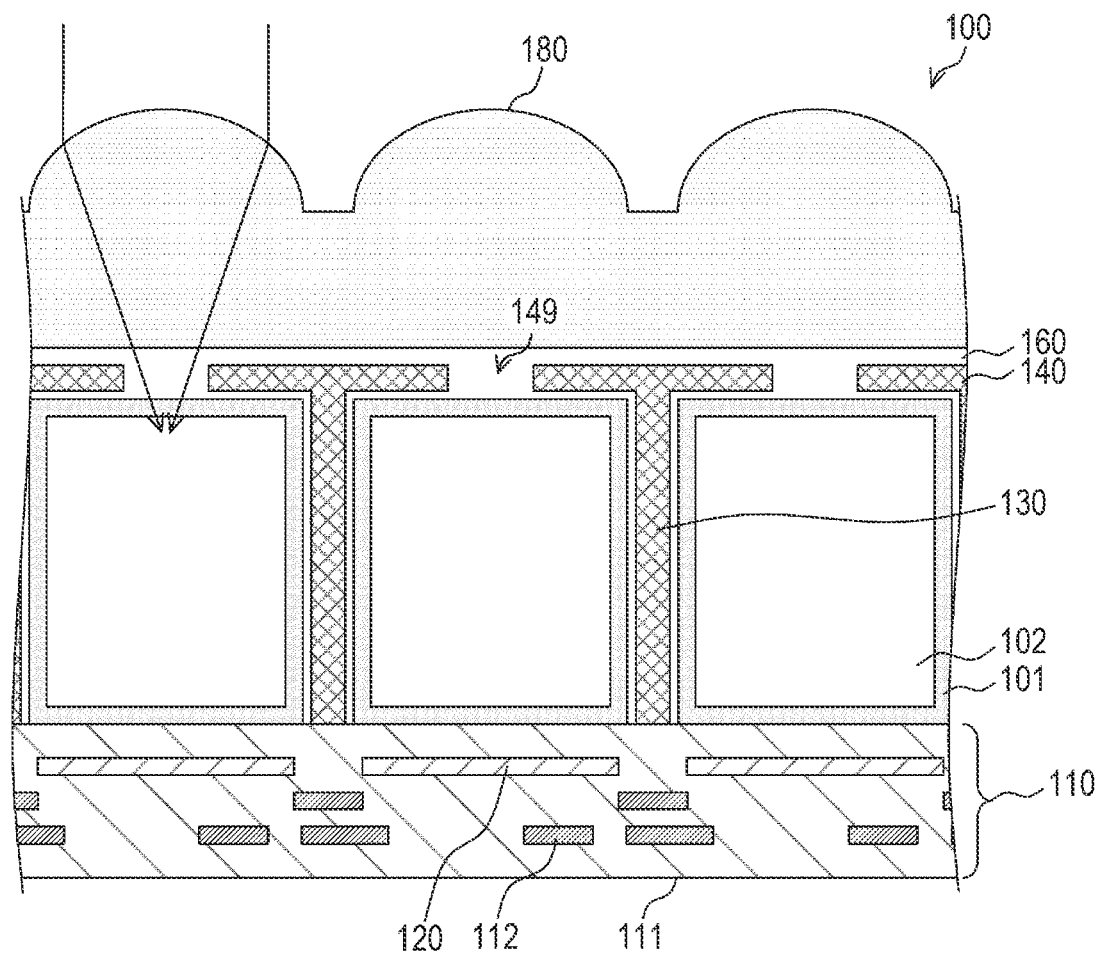
FIG. 2 is a cross-sectional diagram showing an example configuration of a pixel according to a first embodiment of the present disclosure.

FIG. 2 is a cross-sectional diagram showing an example configuration of a pixel according to a first embodiment of the present disclosure. This drawing is a cross-sectional diagram showing an example configuration of a pixel 100. A pixel 100 in the drawing includes a semiconductor substrate 101, a wiring region 110, a front-surface-side reflective film 120, a back-surface-side reflective film 140, a protective film 160, and an on-chip lens 180.

The semiconductor substrate 101 is a semiconductor substrate in which the semiconductor region (diffusion region) of the elements forming the photoelectric conversion unit and the pixel circuit described above is formed. This semiconductor substrate 101 may be formed with silicon (Si), for example. The semiconductor elements such as the photoelectric conversion unit are disposed in a well region formed in the semiconductor substrate 101. For convenience, it is assumed that the semiconductor substrate 101 in the drawing forms a p-type well region. As an n-type semiconductor region is formed in this p-type well region, the diffusion region of the element can be formed. In the semiconductor substrate 101 in the drawing, an n-type semiconductor region 102 forming a photoelectric conversion unit is shown as an example of the element. A photodiode formed by a p-n junction at the interface between the n-type semiconductor region 102 and the surrounding p-type well region corresponds to the photoelectric conversion unit. When the n-type semiconductor region 102 is irradiated with incident light, photoelectric conversion occurs. The electric charges generated by the photoelectric conversion are accumulated in the n-type semiconductor region 102. An image signal is generated by the pixel circuit (not shown) on the basis of the accumulated electric charges.

Note that the semiconductor substrate 101 is an example of the substrate disclosed in the claims. The imaging device 1 is an example of the photoelectric conversion element disclosed in the claims.

Note that a separation region 130 can be disposed at the boundary between the pixels 100 in the semiconductor substrate 101 in the drawing. The separation region 130 optically separates the pixels 100 from each other. Specifically, a film that reflects incident light is disposed as the separation region 130 between the pixels 100, so that leakage of the incident light to the adjacent pixels 100 is prevented. Thus, crosstalk between the pixels 100 can be prevented. The separation region 130 can be formed with a metal such as tungsten (W), for example. Note that a fixed charge film and an insulating film can be disposed between the separation region 130 and the semiconductor substrate 101. The fixed charge film is a film that is disposed at the interface with the semiconductor substrate 101 and pins the surface level of the semiconductor substrate 101. Meanwhile, the insulating film is a film that is disposed between the fixed charge film and the separation region 130, and insulates the separation region 130. Such a separation region 130 can be formed by forming the fixed charge film and the insulating film on the surface of a groove formed in the semiconductor substrate 101 and burying a metal such as W therein. As the separation region 130 including such an insulating film is provided, the pixels 100 can also be electrically isolated from each other.

The wiring region 110 is a region that is disposed adjacent to the surface of the semiconductor substrate 101 and has wiring lines formed therein to transmit signals. The wiring region 110 in the drawing includes a wiring layer 112 and an insulating layer 111. The wiring layer 112 is a conductor that transmits a signal to an element in the semiconductor substrate 101. The wiring layer 112 can be formed with a metal such as copper (Cu) or tungsten (W). The insulating layer 111 insulates the wiring layer 112. The insulating layer 111 can be formed with silicon oxide ($SiO_2$), for example. Note that the wiring layer 112 and the insulating layer 111 can be formed as multilayers. This drawing shows an example of a wiring line formed in two layers. The wiring layers 112 disposed in different layers can be connected to each other by a via plug not shown in the drawing.

Note that the imaging device 1 in the drawing corresponds to a back-illuminated imaging device in which incident light is emitted onto the photoelectric conversion unit from the back surface side of the semiconductor substrate 101. Incident light that enters the semiconductor substrate 101 from the object via the on-chip lens 180 and the back-surface-side reflective film 140 described later is absorbed by the semiconductor substrate 101 and is photoelectrically converted. However, incident light that has not been absorbed by the semiconductor substrate 101 passes through the semiconductor substrate 101, turns into transmitted light, and enters the wiring region 110.

The front-surface-side reflective film 120 is disposed on the front surface side of the semiconductor substrate 101, and reflects transmitted light. The front-surface-side reflective film 120 in the drawing is disposed in the wiring region 110, and is located adjacent to the semiconductor substrate 101 via the insulating layer 111. The front-surface-side reflective film 120 is formed in a shape that covers the front surface side of the semiconductor substrate 101 of the pixel 100. As the front-surface-side reflective film 120 is provided, transmitted light that has passed through the semiconductor substrate 101 can be reflected toward the semiconductor substrate 101. As a result, incident light contributing to photoelectric conversion can be increased. The conversion efficiency of the pixel 100 can be improved. The front-surface-side reflective film 120 can be formed with a metal such as W or Cu. Alternatively, the front-surface-side reflective film 120 can be formed with the wiring layer 112. In this case, the front-surface-side reflective film 120 can be formed at the same time as the wiring layer 112.

The back-surface-side reflective film 140 is disposed on the back surface side of the semiconductor substrate 101, to transmit incident light from the object and further reflect reflected light. The back-surface-side reflective film 140 in the drawing is disposed adjacent to the semiconductor substrate 101 via the protective film 160 to be described later. The back-surface-side reflective film 140 has an opening 149 in its central portion, and transmits incident light condensed by the later-described on-chip lens 180 through the opening 149. The back-surface-side reflective film 140 also reflects the above-mentioned reflected light again, and causes the reflected light to enter the semiconductor substrate 101, to reduce leakage of the reflected light to the outside of the pixel 100. The back-surface-side reflective film 140 can be formed with a metal such as W or Cu, like the front-surface-side reflective film 120 and the separation region 130.

The back-surface-side reflective film 140 can also be formed at the same time as the separation region 130. Specifically, a material film is also formed on the back surface of the semiconductor substrate 101 when the metal to be the material of the separation region 130 is buried in the groove formed in the semiconductor substrate 101. The back-surface-side reflective film 140 can be manufactured by forming the opening 149 in the material film that has been formed. The opening 149 can be designed to have substantially the same size as the size of incident light condensing by the on-chip lens 180.

The protective film 160 is a film that insulates and protects the back surface side of the semiconductor substrate 101. The protective film 160 in the drawing is formed in a shape covering the back-surface-side reflective film 140, and further planarizes the back surface side of the semiconductor substrate 101 on which the back-surface-side reflective film 140 is disposed. The protective film 160 can be formed with $SiO_2$, for example. Note that the fixed charge film described above can be disposed in a portion of the protective film 160 adjacent to the front surface of the semiconductor substrate 101. For the fixed charge film, an oxide of a metal such as hafnium, aluminum, or tantalum can be used, for example.

The on-chip lens 180 is a lens that is provided for each pixel 100 and condenses incident light from the object onto the photoelectric conversion unit of the semiconductor substrate 101. The on-chip lens 180 is formed in a convex-lens shape, and condenses incident light. The on-chip lens 180 in the drawing condenses incident light onto the photoelectric conversion unit via the above-described opening 149 of the back-surface-side reflective film 140. Arrows in the drawing indicates the state of light condensing by the on-chip lens 180. The on-chip lens 180 can be formed with an organic material such as resin or an inorganic material such as silicon nitride (SiN), for example.

As shown in the drawing, incident light is condensed by the on-chip lens 180, and a focal point is formed in a region of the semiconductor substrate 101. Light that has entered the on-chip lens 180 is gradually narrowed while traveling from the on-chip lens 180 to the semiconductor substrate 101, and the condensing size, which is the irradiation range of incident light in the horizontal direction, is narrowed. As the opening 149 of the back-surface-side reflective film 140 is designed to have a size substantially equal to the size of the incident light condensing, it is possible to prevent the back-surface-side reflective film 140 from blocking (vignetting) the incident light condensed by the on-chip lens 180. As the opening 149 is made smaller, leakage of reflected light through the opening 149 can be reduced.

[Configurations of Pixels]

Figure 3A:
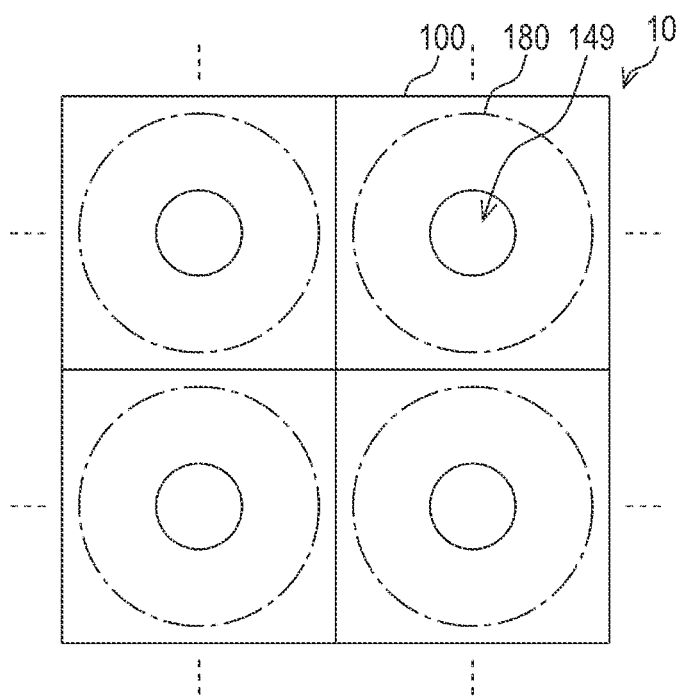
FIGS. 3A and 3B are diagrams showing example configurations of pixels according to the first embodiment of the present disclosure.
Figure 3B:
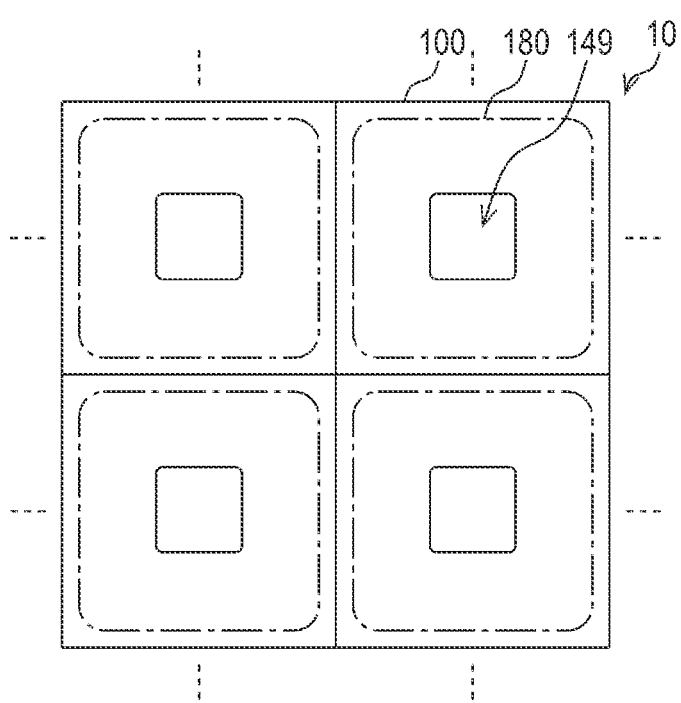

FIGS. 3A and 3B are diagrams showing example configurations of pixels according to the first embodiment of the present disclosure. The drawing is top views showing example configurations of pixels 100 disposed in the pixel array unit 10, and is diagrams each showing the layout of an on-chip lens 180 and a back-surface-side reflective film 140. In the drawing, a dot-and-chain line indicates the shape of the bottom surface of an on-chip lens 180.

FIG. 3A in the drawing is a diagram showing an example of a pixel 100 in which an on-chip lens 180 designed to have a circular bottom surface is disposed. A solid-line circle in FIG. 3A in the drawing indicates the opening 149 of a back-surface-side reflective film 140.

FIG. 3B in the drawing is a diagram showing an example of a pixel 100 in which an on-chip lens 180 designed to have a rectangular bottom surface is disposed. In FIG. 3B in the drawing, the opening 149 of the back-surface-side reflective film 140 can be formed in a rectangular shape.

In this manner, the opening 149 of the back-surface-side reflective film 140 can be changed in accordance with the shape of the bottom surface of the on-chip lens 180.

[Other Configurations of Pixels]

Figure 4A:
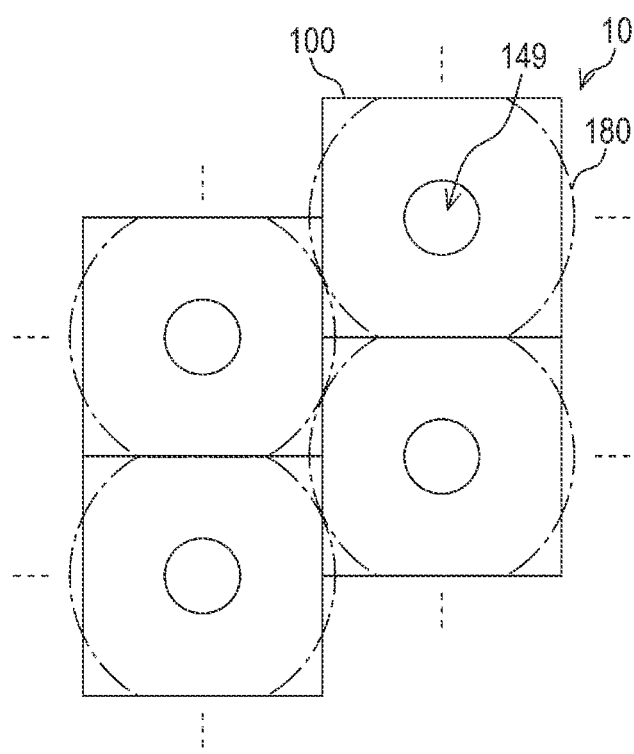
FIGS. 4A and 4B are diagrams showing other example configurations of pixels according to the first embodiment of the present disclosure.
Figure 4B:
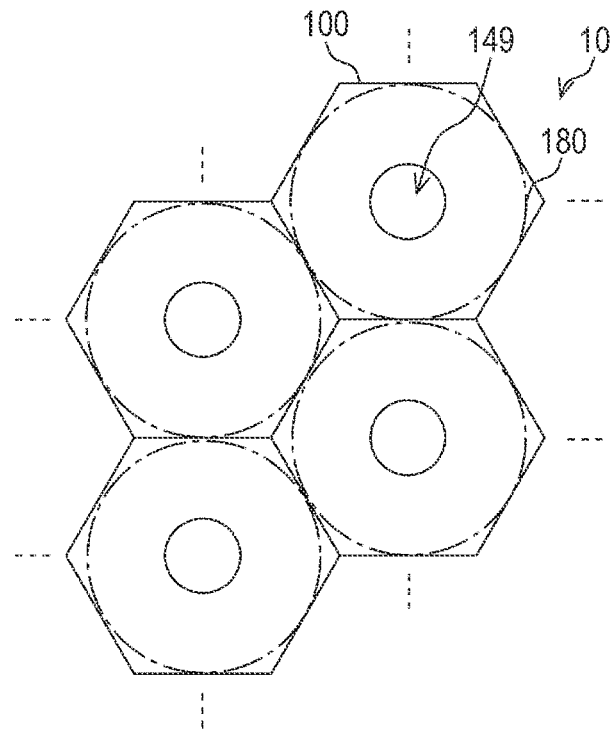

FIGS. 4A and 4B are diagrams showing other example configurations of pixels according to the first embodiment of the present disclosure. This drawing shows top views showing other example configurations of pixels 100 disposed in the pixel array unit 10. The pixels 100 in the drawing show an example in which the pixels 100 adjacent to each other in the horizontal direction in the paper surface are shifted by half the size of a pixel 100 in the vertical direction with respect to each other on the paper surface.

FIG. 4A in the drawing is a diagram showing an example of a rectangular pixel 100. An on-chip lens 180 in FIG. 4A in the drawing is designed to have a shape whose end portion overlaps the region of an adjacent pixel 100 in the horizontal direction on the paper surface. With this arrangement, it is possible to reduce the areas in which the on-chip lens 180 is not present at the corners of the pixel 100. The incident light to be condensed by the on-chip lens 180 can be increased.

FIG. 4B in the drawing is a diagram showing an example of a hexagonal pixel 100. As the pixels 100 are formed in a hexagonal shape and are arranged, it is possible to reduce the areas in which the on-chip lens 180 is not present at the corners of each pixel 100. The size of a pixel 100 can be made smaller while a circular on-chip lens 180 is provided. Note that the opening 149 can also be designed to have a hexagonal shape.

[Reflection of Incident Light]

Figure 5:
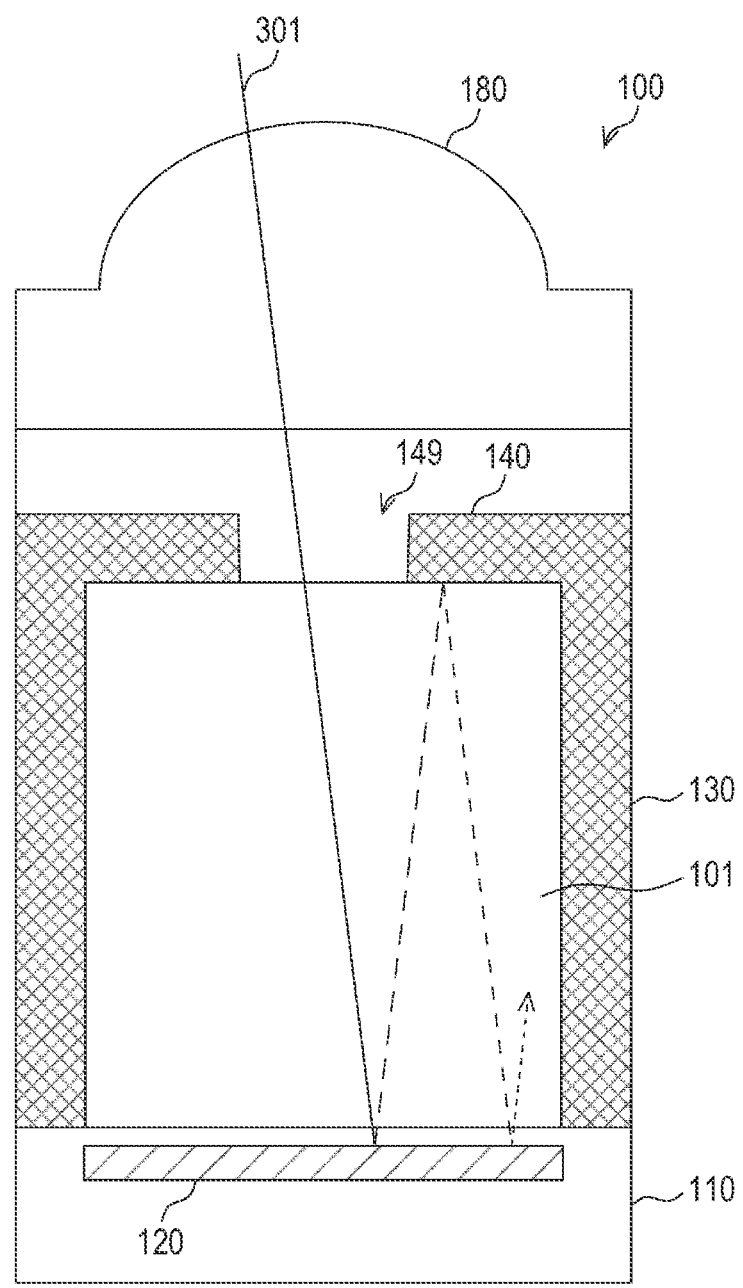
FIG. 5 is a diagram showing an example of incident light reflection according to the first embodiment of the present disclosure.

FIG. 5 is a diagram showing an example of incident light reflection according to the first embodiment of the present disclosure. The drawing is a diagram showing a simplified pixel 100, and is a diagram showing the trajectories of incident light and reflected light in the pixel 100. In the drawing, a solid-line arrow indicates incident light, and dotted-line and dashed-line arrows indicate reflected light. Further, incident light 301 in the drawing shows an example of incident light that is repeatedly reflected by the front-surface-side reflective film 120 and the back-surface-side reflective film 140 after passing through the semiconductor substrate 101. The reflected light gradually attenuates due to photoelectric conversion while being repeatedly reflected, and is absorbed without leaking to the outside of the pixel 100. The incident light can be confined inside the semiconductor substrate 101, and sensitivity can be increased. Further, the opening 149 of the back-surface-side reflective film 140 is made narrower, so that the reflected light passing through the opening 149 from the front-surface-side reflective film 120 can be reduced. Leakage of the reflected light to the outside of the pixel 100 can be reduced. When the reflected light enters a nearby pixel 100 again after leaking to the outside of the pixel 100, the reflected light causes noise such as flare. As the opening 149 is narrowed, noise can be reduced, and degradation of image quality can be prevented.

[Other Configurations of Pixels]

Figure 6A:
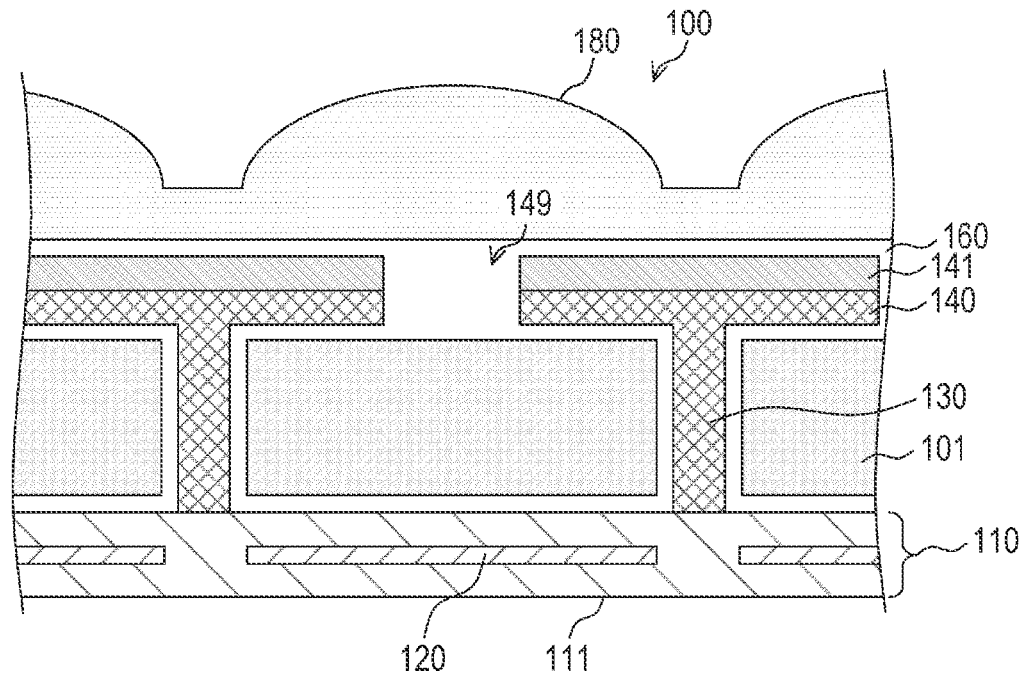
FIGS. 6A and 6B are cross-sectional diagrams showing other example configurations of pixels according to the first embodiment of the present disclosure.

FIGS. 6A ands 6B are cross-sectional diagrams showing other example configurations of pixels according to the first embodiment of the present disclosure. The drawing is cross-sectional diagrams showing other example configurations of simplified pixels 100.

FIG. 6A in the drawing is a diagram showing an example case where a back-surface-side reflective film 141 is further provided. The back-surface-side reflective film 141 is formed with a metallic material different from that of the back-surface-side reflective film 140, and can be stacked on the back-surface-side reflective film 140. For example, the back-surface-side reflective film 141 is formed with W, and the back-surface-side reflective film 140 on the side adjacent to the semiconductor substrate 101 is formed with titanium (Ti). The back-surface-side reflective film 140 formed with Ti can be used as a base metal for the back-surface-side reflective film 141 formed with W, and the adhesion strength of the back-surface reflective film can be increased.

Figure 6B:
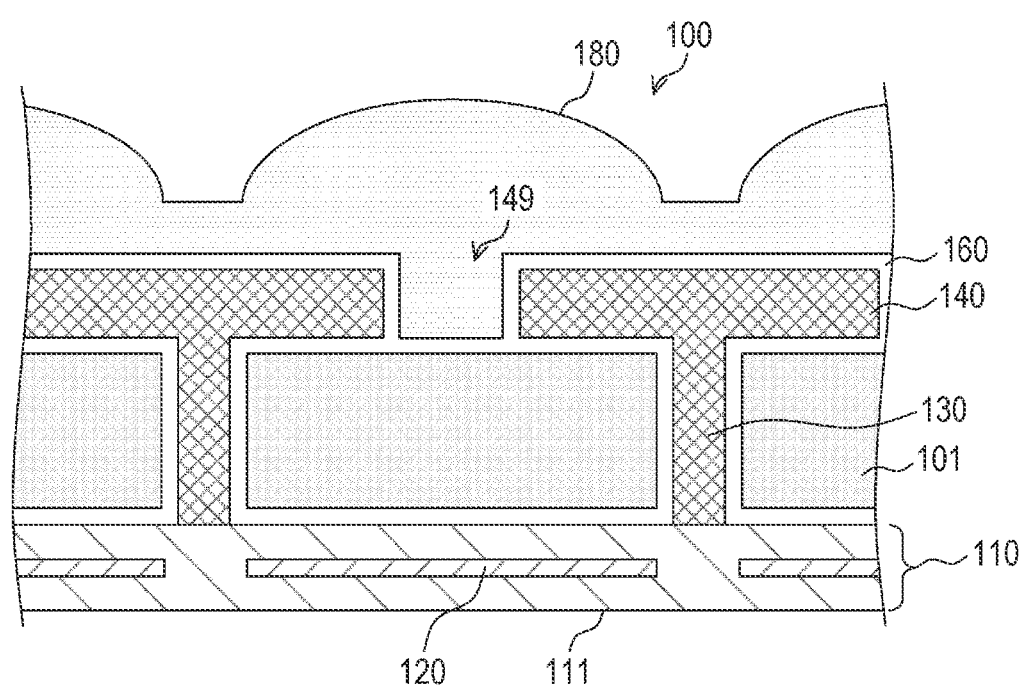

FIG. 6B in the drawing is a diagram showing an example case where a resin is disposed in the opening 149. As this resin, the resin forming the on-chip lens 180 can be used. In FIG. 6B in the drawing, the protective film 160 is formed in a shape that covers the surface of the back-surface-side reflective film 140 in the opening 149.

As described above, in the imaging device 1 according to the first embodiment of the present disclosure, the back-surface-side reflective film 140 having the opening 149 and the front-surface-side reflective film 120 are disposed on the semiconductor substrate of the pixel 100, to alternately reflect transmitted light based on incident light entering through the opening 149. With this arrangement, incident light can be confined inside the semiconductor substrate 101 of the pixel 100, and reflected light from the imaging device 1 can be reduced.

2. Second Embodiment

The imaging device 1 of the first embodiment described above includes the back-surface-side reflective film 140 having the cylindrical opening 149. However, an imaging device 1 according to a second embodiment of the present disclosure differs from the above-described first embodiment in including a back-surface-side reflective film having an opening in a shape depending on the light condensing to be performed by the on-chip lens 180.

[Configurations of Pixels]

Figure 7A:
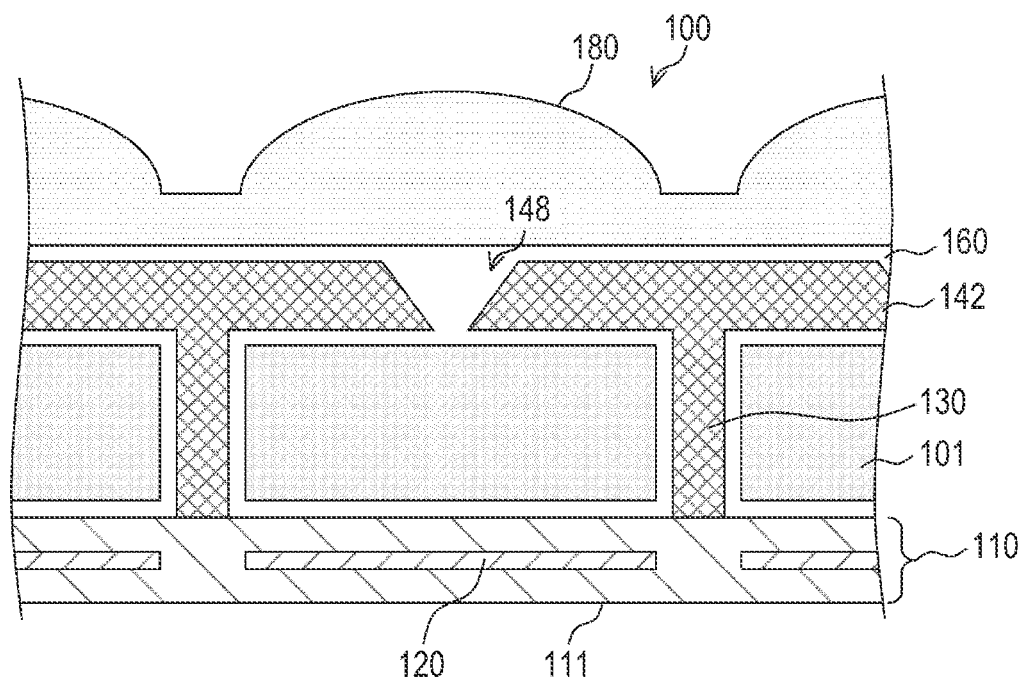
FIGS. 7A and 7B are cross-sectional diagrams showing example configurations of pixels according to a second embodiment of the present disclosure.
Figure 7B:
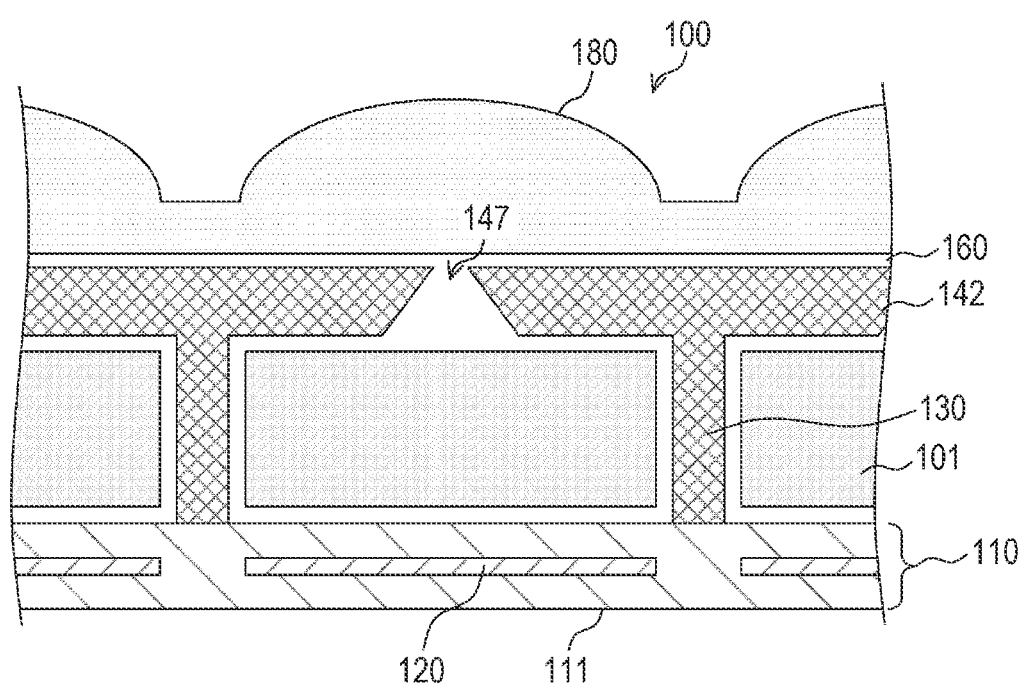

FIGS. 7A and 7B are cross-sectional diagrams showing example configurations of pixels according to the second embodiment of the present disclosure. The drawing shows diagrams in which the configuration of a pixel 100 is simplified, and shows cross-sectional diagrams showing example configurations of pixels 100, like FIG. 2. The pixels 100 differ from the pixel 100 described with reference to FIG. 2 in including a back-surface-side reflective film 142 in place of the back-surface-side reflective film 140.

The back-surface-side reflective film 142 in the drawing has an opening in which the opening area on the side of the on-chip lens 180 differs from the opening area on the side of the semiconductor substrate 101. FIG. 7A in the drawing is a diagram showing an example in which a back-surface-side reflective film 142 having a tapered opening 148 is provided. The opening 148 has a smaller opening area on the side adjacent to the semiconductor substrate 101 than on the side adjacent to the on-chip lens 180. As the opening area on the side adjacent to the on-chip lens 180 is made larger, and the opening area on the opposite side is made smaller as above, the opening can be formed in a shape depending on the reduction in the size of light condensing by the on-chip lens 180. The diameter of the opening 148 on the side adjacent to the semiconductor substrate 101 can be designed to have almost the same size as the wavelength of incident light. As the opening area on the side adjacent to the semiconductor substrate 101 is made smaller, more transmitted light can be reflected while vignetting of incident light is prevented.

FIG. 7B in the drawing is a diagram showing an example in which a back-surface-side reflective film 142 having an inverse tapered opening 147 is provided. The opening 147 has a smaller opening area on the side adjacent to the on-chip lens 180 than on the side adjacent to the semiconductor substrate 101. The on-chip lens 180 in FIG. 7B in the drawing is formed in a shape that forms a focal point in the vicinity of the opening 147 on the side adjacent to the on-chip lens 180. With this arrangement, the opening 147 has a shape substantially equal to the trajectory when incident light condensed at the focal position is diffused. As described above, in the pixel 100 in FIG. 7B in the drawing, the opening area on the side adjacent to the semiconductor substrate 101 is made larger, and the opening area on the opposite side is made smaller. The diameter of the opening 147 on the side adjacent to the on-chip lens 180 can be designed to have almost the same size as the wavelength of incident light. More transmitted light can be reflected while vignetting of incident light is prevented, as in FIG. 7A in the drawing.

As described above, each pixel 100 in the drawing includes the back-surface-side reflective film 142 having either the opening 148 or the opening 147 in which the opening area on the side of the on-chip lens 180 differs from the opening area on the side of the semiconductor substrate 101. As these openings are designed to have a shape depending on the trajectory of incident light condensed by the on-chip lens 180, vignetting of incident light can be prevented even in a case where a thick back-surface-side reflective film is formed.

The other components of the imaging device 1 are similar to the components of the imaging device 1 described in the first embodiment of the present disclosure, and therefore, explanation of them is not made herein.

As described above, the imaging device 1 according to the second embodiment of the present disclosure includes a back-surface-side reflective film in which the opening area on the side of the on-chip lens 180 differs from the opening area on the side of the semiconductor substrate 101. With this arrangement, the opening area can be reduced while vignetting of incident light is prevented. Leakage of reflected light can be further reduced.

3. Third Embodiment

In the imaging device 1 of the first embodiment described above, reflected light partially leaks from the opening 149 of the back-surface-side reflective film 140. On the other hand, an imaging device 1 according to a third embodiment of the present disclosure differs from the above-described first embodiment in scattering reflected light leaking from the opening 149.

[Configuration of a Pixel]

Figure 8:
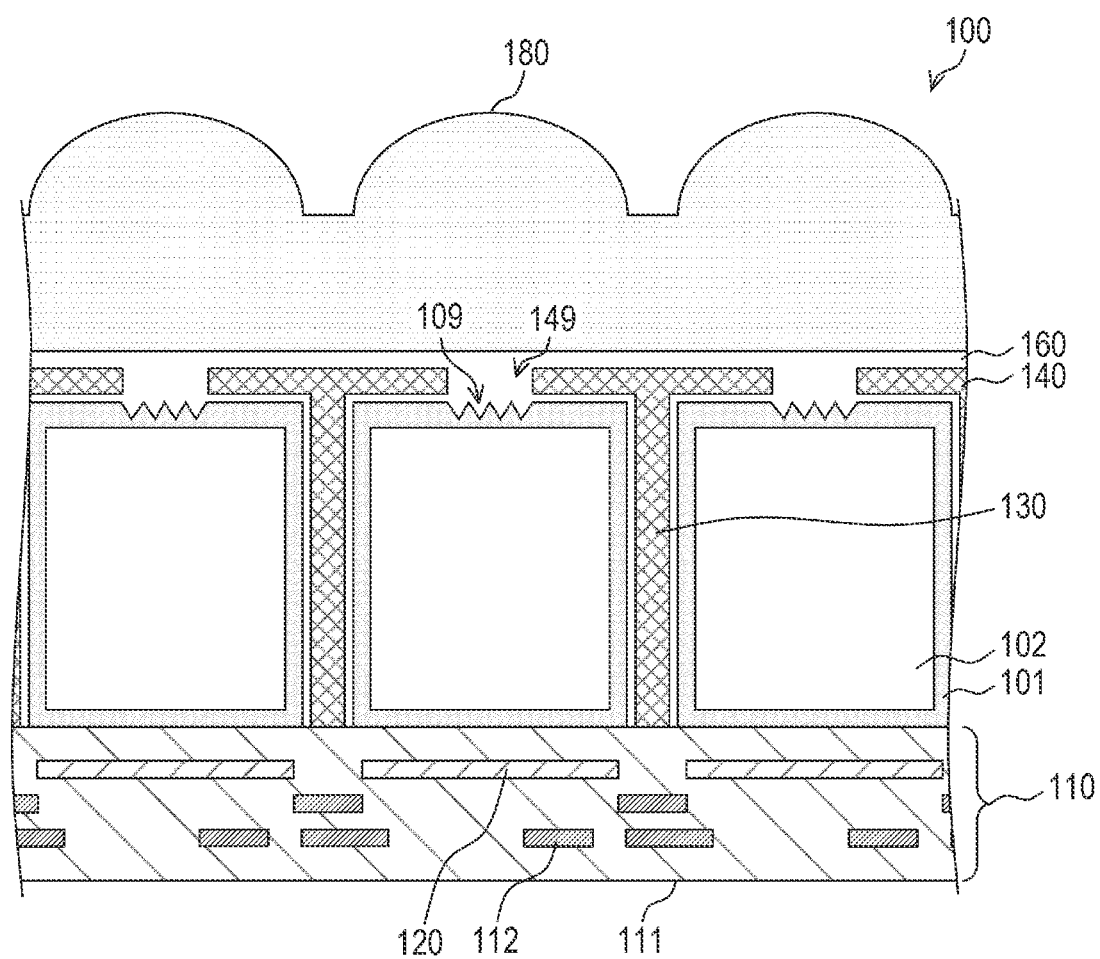
FIG. 8 is a cross-sectional diagram showing an example configuration of a pixel according to a third embodiment of the present disclosure.

FIG. 8 is a cross-sectional diagram showing an example configuration of a pixel according to a third embodiment of the present disclosure. Like FIG. 2, this drawing is a cross-sectional diagram showing an example configuration of a pixel 100. The pixel 100 differs from the pixel 100 described with reference to FIG. 2 in that a substrate-back-surface scattering portion 109 is formed in the semiconductor substrate 101.

The substrate-back-surface scattering portion 109 is formed in the back surface of the semiconductor substrate 101, and scatters incident light and reflected light. The substrate-back-surface scattering portion 109 can be formed with irregularities formed in the back surface of the semiconductor substrate 101. The substrate-back-surface scattering portion 109 in the drawing is located in the vicinity of the opening 149 of the back-surface-side reflective film 140. As reflected light leaking to the outside of the pixel 100 through the opening 149 is scattered by the substrate-back-surface scattering portion 109, the reflected light is dispersed and emitted over a wide range. Accordingly, flare and the like can be made inconspicuous. The substrate-back-surface scattering portion 109 can be formed by performing etching on part of the back surface of the semiconductor substrate 101, for example. For example, it is possible to form the substrate-back-surface scattering portion 109 by performing anisotropic etching on the back surface of the semiconductor substrate 101 and thus forming a plurality of V-shaped recesses shown in the drawing.

The other components of the imaging device 1 are similar to the components of the imaging device 1 described in the first embodiment of the present disclosure, and therefore, explanation of them is not made herein.

As described above, the imaging device 1 according to the third embodiment of the present disclosure has the substrate-back-surface scattering portion 109 on the back surface side of the semiconductor substrate 101, to scatter reflected light leaking to the outside of the pixel 100. With this arrangement, image quality can be improved.

4. Fourth Embodiment

The imaging device 1 of the third embodiment described above has the substrate-back-surface scattering portion 109 in the vicinity of the opening 149 of the back-surface-side reflective film 140, to scatter reflected light that is leaking. On the other hand, an imaging device 1 according to a fourth embodiment of the present disclosure differs from the above-described third embodiment in including a substrate reflective portion that causes the semiconductor substrate 101 to reflect reflected light in the vicinity of the opening 149.

[Configurations of Pixels]

FIGS. 9A and 9B are cross-sectional diagrams showing example configurations of pixels according to the fourth embodiment of the present disclosure. Like FIG. 8, this drawing shows cross-sectional diagrams showing example configurations of pixels 100. The pixels 100 differ from the pixel 100 described with reference to FIG. 8 in further including a substrate reflective portion on the back surface side of the semiconductor substrate 101 in the vicinity of the opening 149.

FIG. 9A in the drawing is a diagram showing an example case where a substrate reflective portion 108 in a groove-like shape formed in the back surface of the semiconductor substrate 101 is provided. The substrate reflective portion 108 is formed in the vicinity of the edge portion of the back-surface-side reflective film 140 in the opening 149. The substrate reflective portion 108 can be formed in the following manner: a groove is formed by performing etching on the back surface of the semiconductor substrate 101 along the contour of the opening 149, and a member having a different refractive index from that of the semiconductor substrate 101, such as the protective film 160, is disposed therein. Reflected light is reflected again at the interface between the substrate reflective portion 108 and the protective film 160. This reduces reflected light reaching the opening 149. Reflected light leaking from the opening 149 can be reduced.

FIG. 9B in the drawing is a diagram showing an example of a substrate reflective portion 107 in which a metal member is disposed. Like the substrate reflective portion 108 described above, the substrate reflective portion 107 can be formed in the following manner: a groove is formed in the semiconductor substrate 101, and a metal is buried in the groove. A back-surface-side reflective film 143 in the drawing is a back-surface-side reflective film formed by extending the metal forming the back-surface-side reflective film into the groove described above. Reflected light is reflected again by the substrate reflective portion 107 formed with the metal buried in the semiconductor substrate 101 in the vicinity of the opening 149.

[Other Configurations of Pixels]

Figure 10A:
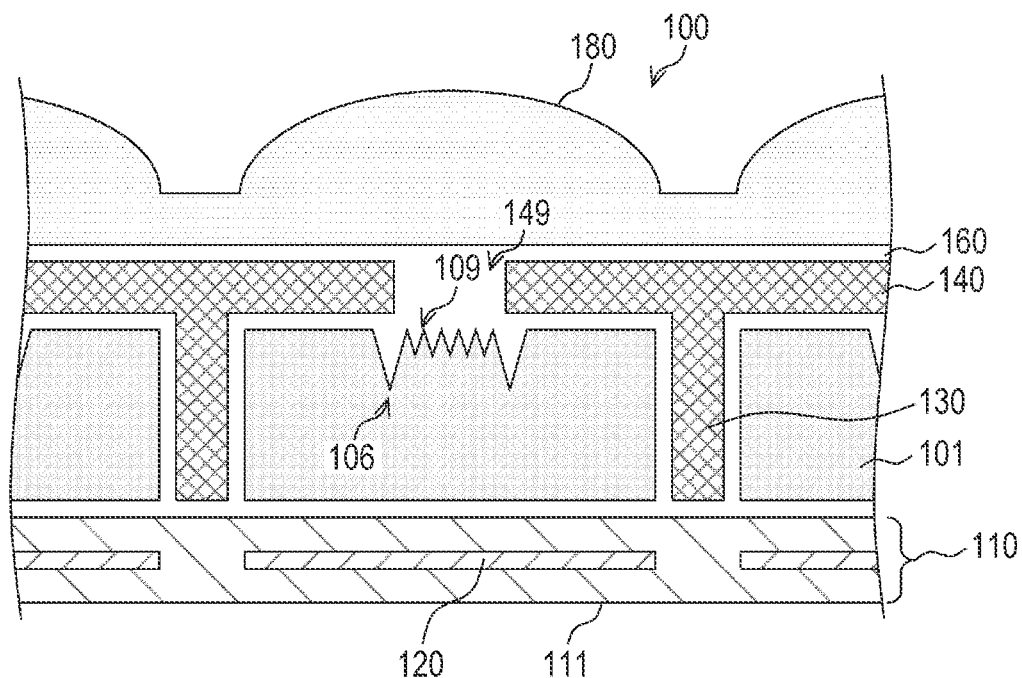
FIGS. 10A and 10B are cross-sectional diagrams showing other example configurations of pixels according to the fourth embodiment of the present disclosure.
Figure 10B:
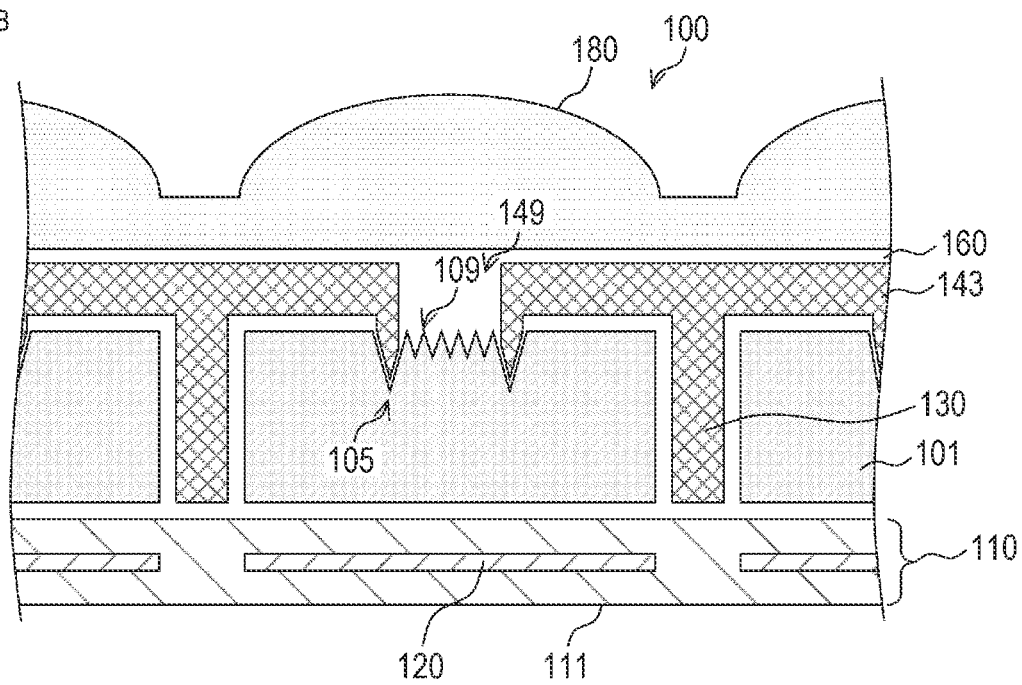

FIGS. 10A, 10B, 11A, and 11B are cross-sectional diagrams showing other example configurations of pixels according to the fourth embodiment of the present disclosure. FIG. 10A is a diagram showing an example case where a substrate reflective portion 106 is provided. The substrate reflective portion 106 is formed with a V-shaped recess similar to the substrate-back-surface scattering portion 109, and is formed by performing etching deeper than the substrate-back-surface scattering portion 109. FIG. 10B is a diagram showing an example case where a substrate reflective portion 105 is provided. The substrate reflective portion 105 can be formed by burying a metal in a V-shaped recess similar to that of the substrate reflective portion 106 described above. The back-surface-side reflective film 143 in FIG. 10B is formed by extending the metal forming the back-surface-side reflective film into the above-described V-shaped recess.

Figure 11A:
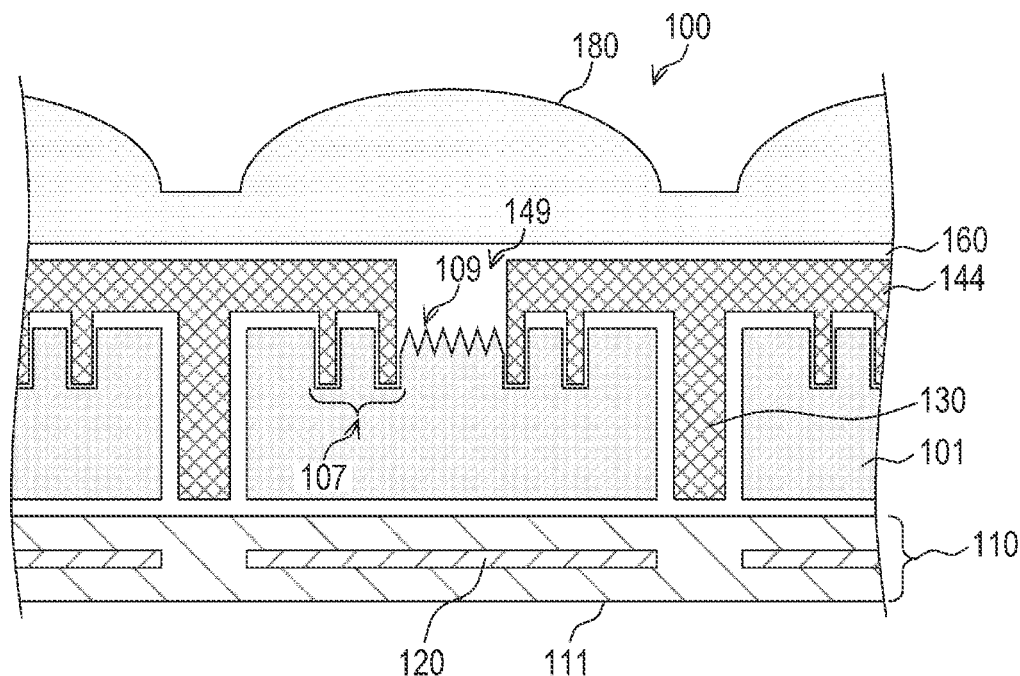
FIGS. 11A and 11B are cross-sectional diagrams showing other example configurations of pixels according to the fourth embodiment of the present disclosure.

FIG. 11A is a diagram showing an example case where a plurality of substrate reflective portions 107 is provided. In the semiconductor substrate 101 in FIG. 11A, concentric grooves surrounding the opening 149 are formed in the back surface. A back-surface-side reflective film 144 in FIG. 11A is formed by extending the metal forming the back-surface-side reflective film into these grooves.

Figure 11B:
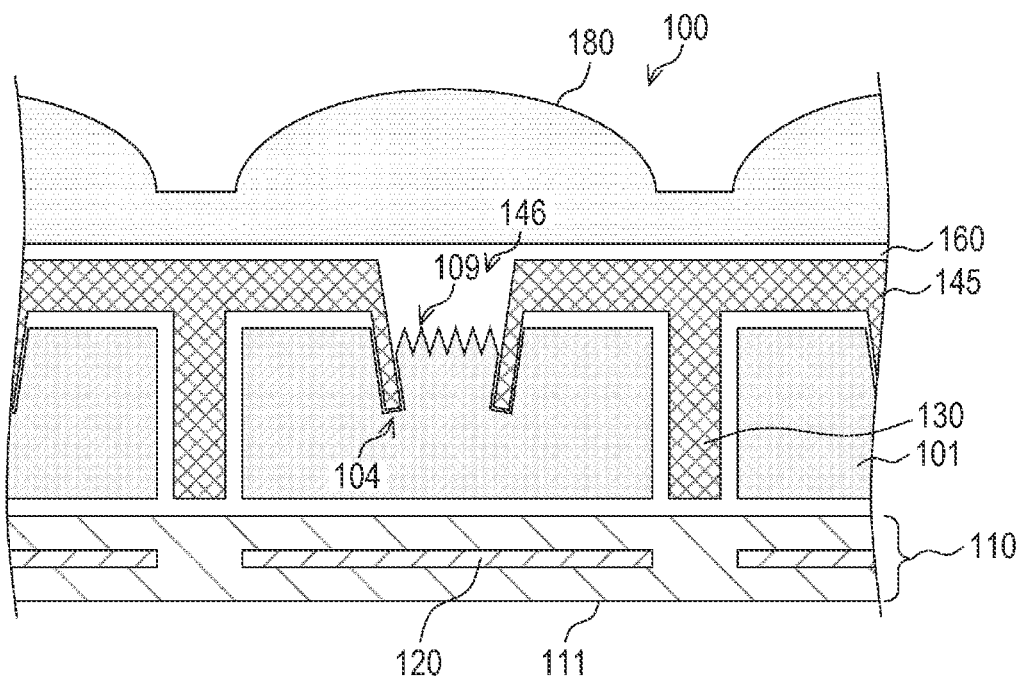

FIG. 11B is a diagram showing an example case where a groove-like substrate reflective portion 104 formed in a tapered shape is provided. A back-surface-side reflective film 145 in FIG. 11B is formed by extending the metal forming the back-surface-side reflective film into the tapered groove in the back surface of the semiconductor substrate 101. An opening 146 of the back-surface-side reflective film 145 is also formed in a tapered shape. When incident light travels inside the semiconductor substrate 101, the propagation speed decreases with the relative dielectric constant of the semiconductor substrate 101, and the wavelength becomes shorter. Therefore, the tapered substrate reflective portion 104 is provided, so that the size of the opening 146 on the side of the semiconductor substrate 101 can be further reduced while vignetting of incident light by the substrate reflective portion 104 is prevented. Leakage of reflected light can be further reduced.

The other components of the imaging device 1 are similar to the components of the imaging device 1 described in the third embodiment of the present disclosure, and therefore, explanation of them is not made herein.

As described above, in the imaging device 1 according to the fourth embodiment of the present disclosure, one of the substrate reflective portions 104 to 108 is provided, to reflect again the light reflected toward the opening 149 of the back-surface-side reflective film 140. With this arrangement, reflected light leaking from the opening 149 can be further reduced.

5. Fifth Embodiment

In the imaging device 1 of the third embodiment described above, the substrate-back-surface scattering portion 109 is formed on the back surface side of the semiconductor substrate 101. On the other hand, an imaging device 1 according to a fifth embodiment of the present disclosure differs from the above-described third embodiment in that a scattering portion is provided on the front surface side of the semiconductor substrate 101.

[Configuration of a Pixel]

Figure 12:
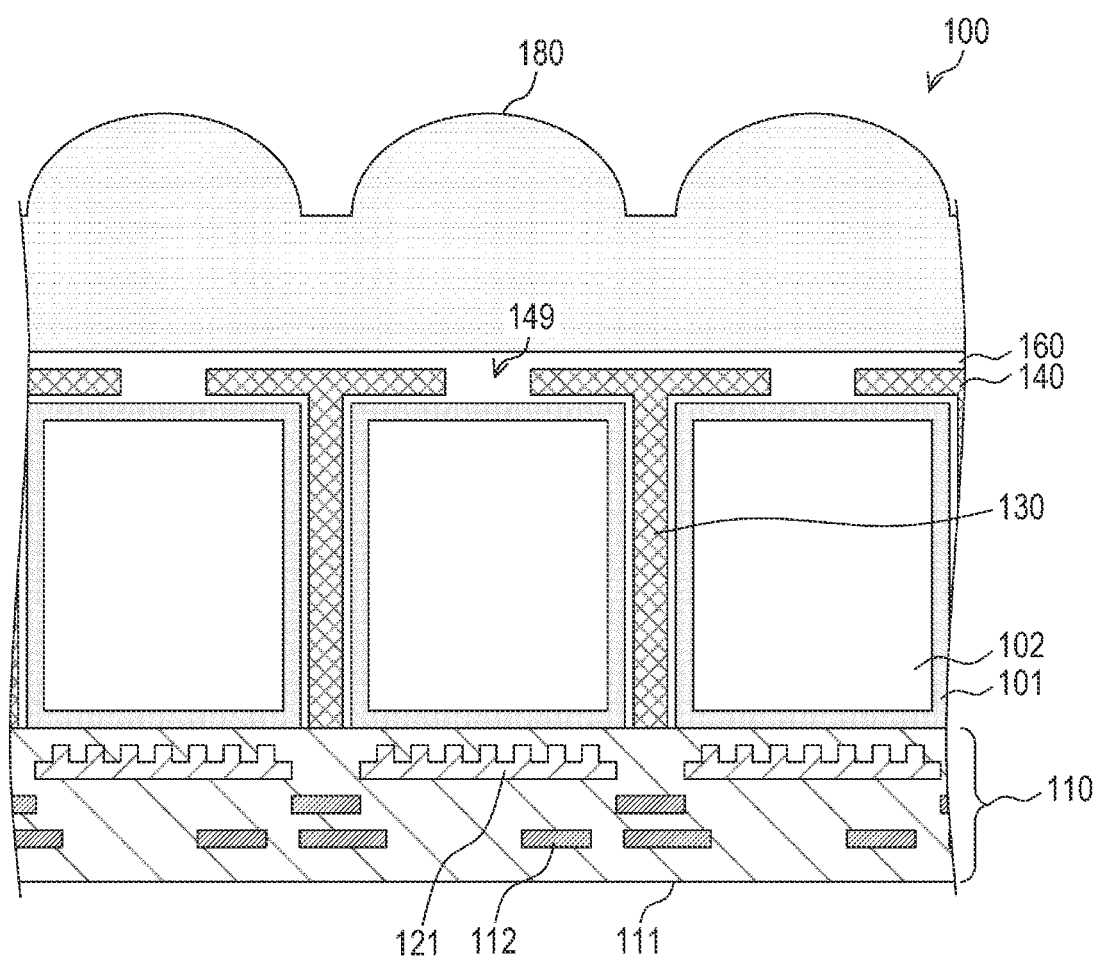
FIG. 12 is a cross-sectional diagram showing an example configuration of a pixel according to a fifth embodiment of the present disclosure.

FIG. 12 is a cross-sectional diagram showing an example configuration of a pixel according to the fifth embodiment of the present disclosure. Like FIG. 2, this drawing is a cross-sectional diagram showing an example configuration of a pixel 100. The pixel 100 differs from the pixel 100 described with reference to FIG. 2 in that a substrate-front-surface scattering portion 121 is provided on the front surface side of the semiconductor substrate 101.

The substrate-front-surface scattering portion 121 reflects and scatters incident light that has passed through the semiconductor substrate 101. The substrate-front-surface scattering portion 121 in the drawing can be formed with a front-surface-side reflective film having irregularities. Specifically, irregularities are formed in a wiring layer 112 provided in the wiring region 110, to form the substrate-front-surface scattering portion 121. As the substrate-front-surface scattering portion 121 is provided, incident light that has passed through the semiconductor substrate 101 is reflected and scattered, to enter the semiconductor substrate 101 again. With this arrangement, reflected light irradiating the outside of the pixel 100 from the opening 149 of the back-surface-side reflective film 140 can be scattered, and flare and the like can be made inconspicuous.

[Other Configurations of Pixels]

Figure 13A:
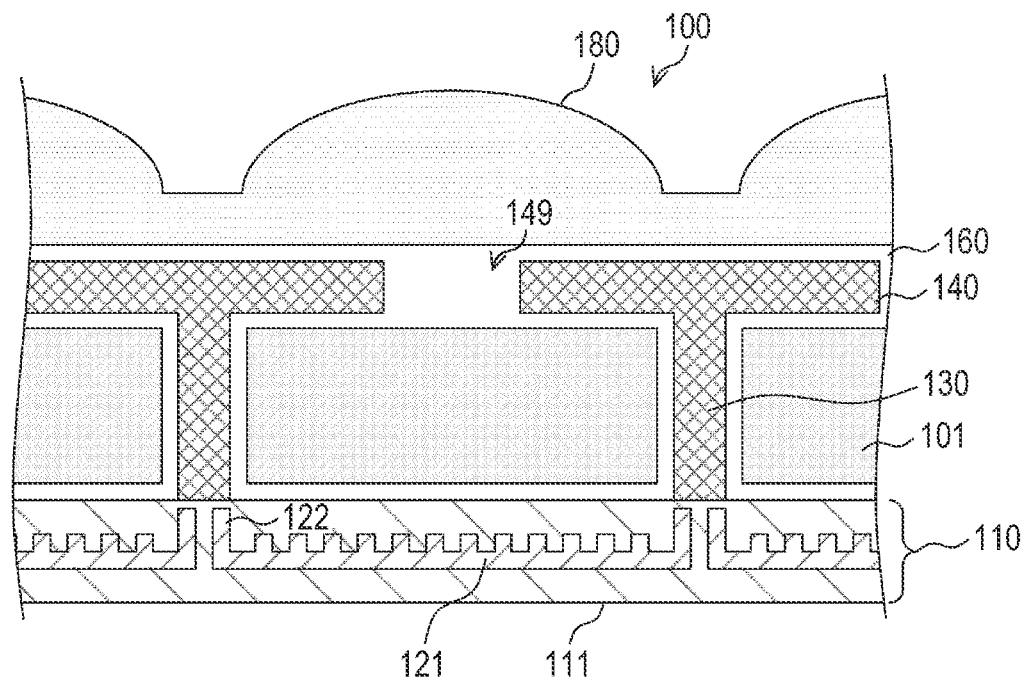
FIGS. 13A and 13B are cross-sectional diagrams showing other example configurations of pixels according to the fifth embodiment of the present disclosure.
Figure 13B:
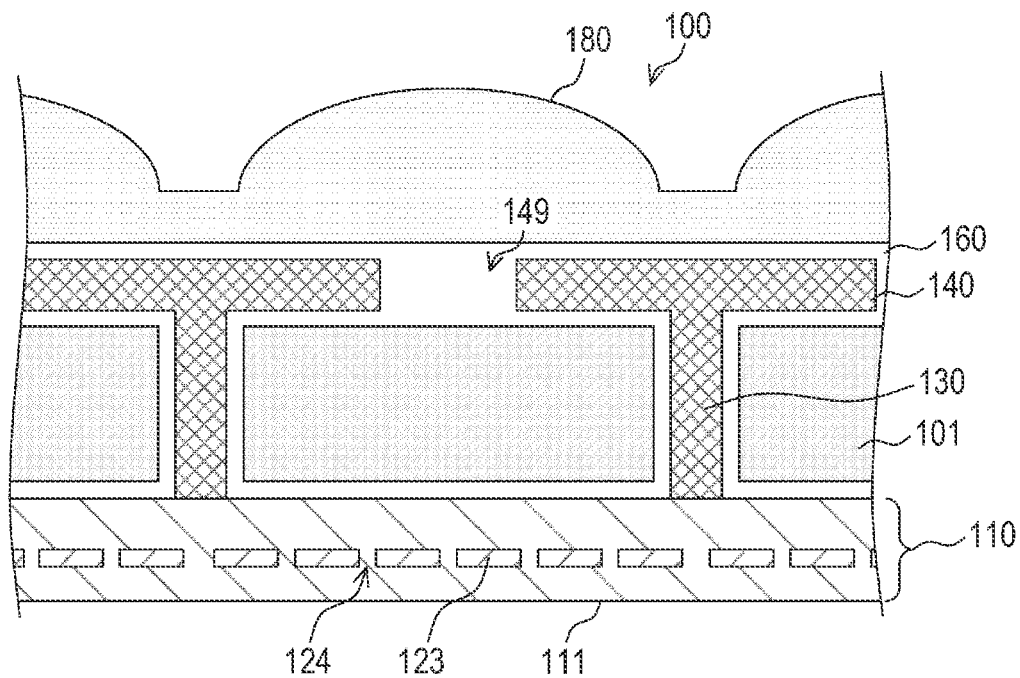

FIGS. 13A and 13B are cross-sectional diagrams showing other example configurations of pixels according to the fifth embodiment of the present disclosure. FIG. 13A is a diagram showing an example in which a wall portion 122 is further provided at the edge of the substrate-front-surface scattering portion 121. The wall portion 122 is formed in a shape to surround the semiconductor substrate 101 separated by the separation region 130, and reflects transmitted light. The wall portion 122 can be formed with a member similar to the substrate-front-surface scattering portion 121. As the wall portion 122 is provided, transmitted light traveling in the vicinity of the edge of the substrate-front-surface scattering portion 121 can be reflected, and transmitted light passing through the wiring region 110 can be reduced. The sensitivity of the pixel 100 can be further improved.

FIG. 13B is a diagram showing an example case where a substrate-front-surface scattering portion 123 is provided. The substrate-front-surface scattering portion 123 can be formed with a metal film that has a plurality of slits 124 formed therein. The slits 124 are designed to have a width that is smaller than the wavelength of transmitted light. The plurality of slits 124 can scatter reflected light from the substrate-front-surface scattering portion 123.

The other components of the imaging device 1 are similar to the components of the imaging device 1 described in the third embodiment of the present disclosure, and therefore, explanation of them is not made herein.

As described above, the imaging device 1 according to the fifth embodiment of the present disclosure scatters reflected light with the substrate-front-surface scattering portions 121 and 123 disposed on the front surface side of the semiconductor substrate 101. As the reflected light leaking to the outside of the pixel 100 is scattered, image quality can be improved.

6. Sixth Embodiment

In the imaging device 1 of the fifth embodiment described above, the substrate-front-surface scattering portion 121 and the like are disposed in the wiring region 110. On the other hand, an imaging device 1 according to a sixth embodiment of the present disclosure differs from the above-described fifth embodiment in that a scattering portion is formed in the front surface of the semiconductor substrate 101.

[Configuration of a Pixel]

Figure 14:
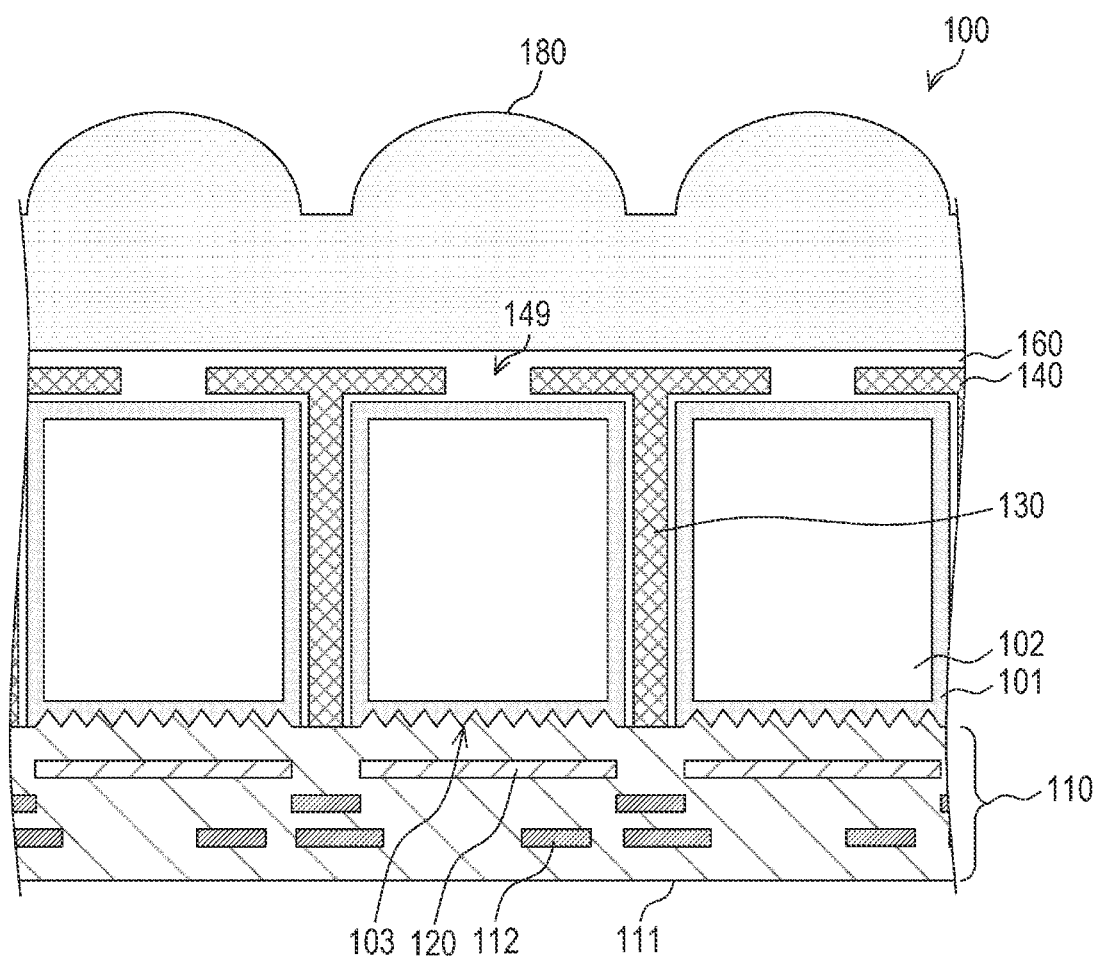
FIG. 14 is a cross-sectional diagram showing an example configuration of a pixel according to a sixth embodiment of the present disclosure.

FIG. 14 is a cross-sectional diagram showing an example configuration of a pixel according to the sixth embodiment of the present disclosure. Like FIG. 2, this drawing is a cross-sectional diagram showing an example configuration of a pixel 100. The pixel 100 differs from the pixel 100 described with reference to FIG. 2 in that a substrate-front-surface scattering portion 103 is provided in the front surface of the semiconductor substrate 101.

The substrate-front-surface scattering portion 103 is a scattering portion that is formed with irregularities formed in the front surface of the semiconductor substrate 101. Like the irregularities of the substrate-back-surface scattering portion 109 described with reference to FIG. 8, the irregularities of the substrate-front-surface scattering portion 103 scatter transmitted light and light reflected by the front-surface-side reflective film 120.

The other components of the imaging device 1 are similar to the components of the imaging device 1 described in the first embodiment of the present disclosure, and therefore, explanation of them is not made herein.

As described above, the imaging device 1 according to the sixth embodiment of the present disclosure scatters reflected light with the substrate-front-surface scattering portion 103 formed on the front surface side of the semiconductor substrate 101. As the reflected light leaking to the outside of the pixel 100 is scattered, image quality can be improved.

7. Seventh Embodiment

In the imaging device 1 of the first embodiment described above, transmitted light is reflected by the front-surface-side reflective film 120. On the other hand, an imaging device 1 according to a seventh embodiment of the present disclosure differs from the above-described first embodiment in that the transmitted light to be reflected by the front-surface-side reflective film is adjusted.

[Configuration of a Pixel]

Figure 15:
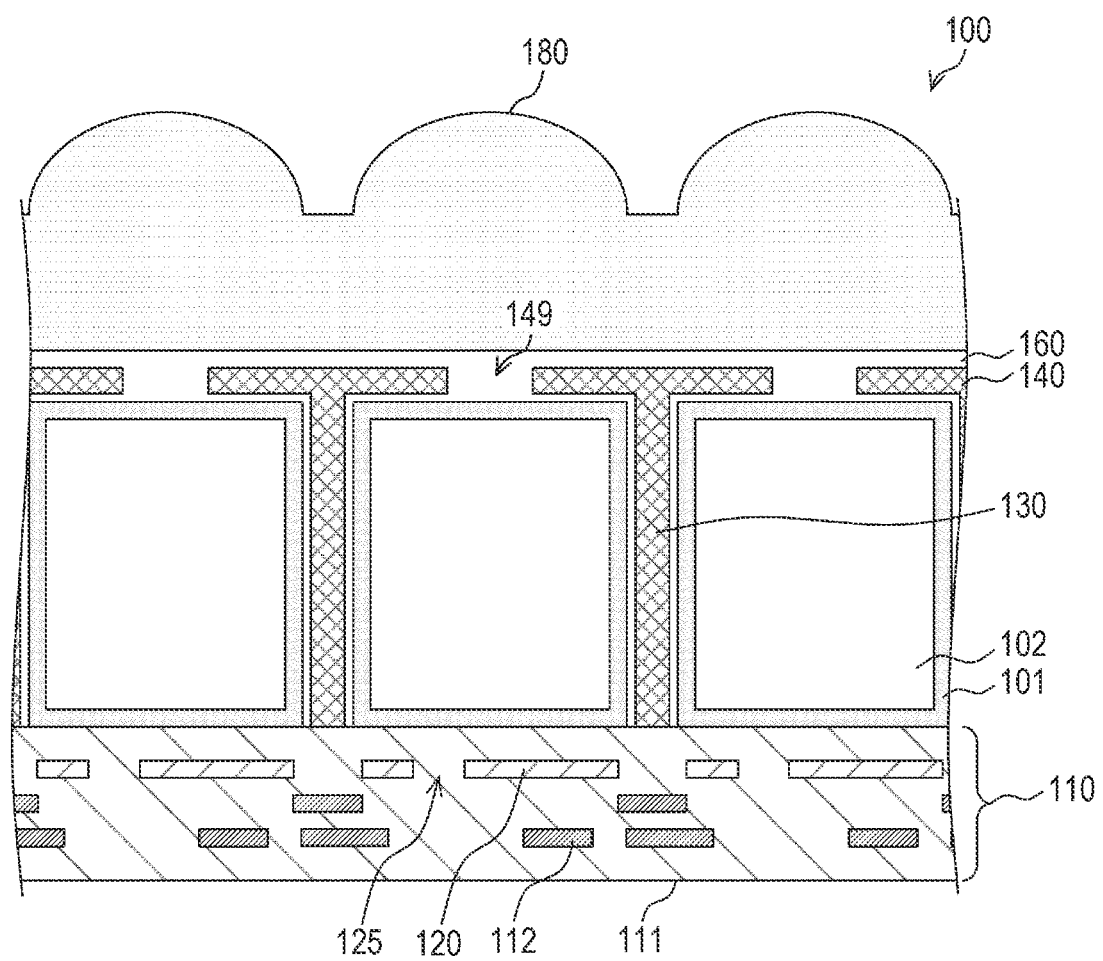
FIG. 15 is a cross-sectional diagram showing an example configuration of a pixel according to a seventh embodiment of the present disclosure.

FIG. 15 is a cross-sectional diagram showing an example configuration of a pixel according to the seventh embodiment of the present disclosure. Like FIG. 2, this drawing is a cross-sectional diagram showing an example configuration of a pixel. The imaging device 1 differs from the imaging device 1 shown in FIG. 2 in that a reflection adjustment portion 125 is formed in the front-surface-side reflective film 120.

The reflection adjustment portion 125 adjusts the transmitted light to be reflected by the front-surface-side reflective film 120. The reflection adjustment portion 125 adjusts the transmitted light to be reflected, by further transmitting part of the transmitted light that enters the front-surface-side reflective film 120. The reflection adjustment portion 125 in the drawing is formed with an opening formed in the front-surface-side reflective film 120. As the reflection adjustment portion 125 is provided, the sensitivity of the pixel 100 can be adjusted.

[Planar Configurations of Pixels]

Figure 16A:
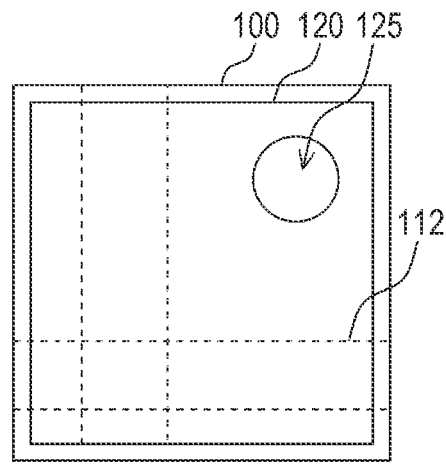
FIGS. 16A, 16B, and 16C are diagrams showing example configurations of pixels according to the seventh embodiment of the present disclosure.
Figure 16B:
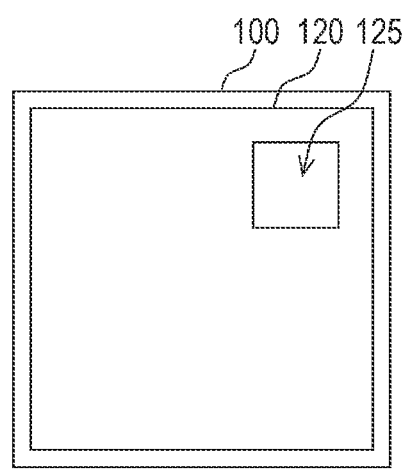
Figure 16C:
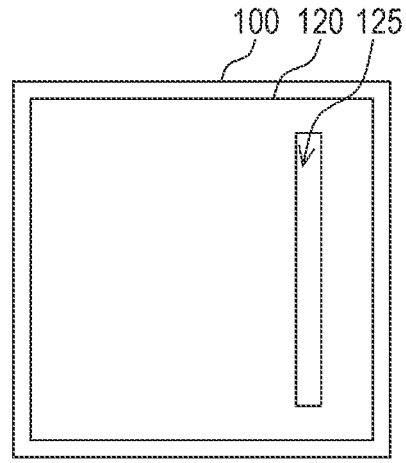

FIGS. 16A, 16B, and 16C are diagrams showing example configurations of pixels according to the seventh embodiment of the present disclosure. The drawing is diagrams each showing an example configuration of the reflection adjustment portion 125 in the front-surface-side reflective film 120 of the pixel 100.

FIG. 16A is a diagram showing an example of a reflection adjustment portion 125 formed in a circular shape. FIG. 16B is a diagram showing an example of a reflection adjustment portion 125 formed in a rectangular shape. FIG. 16C is a diagram showing an example of a reflection adjustment portion 125 formed in a slit-like shape. As described above, the reflection adjustment portion 125 can adopt various kinds of shapes.

Note that the reflection adjustment portion 125 is preferably located at a position not overlapping the wiring layer 112 disposed in the wiring region 110. This aspect is now described with reference to FIG. 16A in the drawing. In FIG. 16A in the drawing, dotted lines indicate the region of the wiring layer 112. The reflection adjustment portion 125 is disposed at a position not overlapping the wiring layer 112. With this arrangement, light that has passed through the reflection adjustment portion 125 passes through the wiring region 110, without being reflected by the wiring layer 112. Of the transmitted light subjected to the reflection adjustment by the reflection adjustment portion 125, the amount of light entering the semiconductor substrate 101 can be reduced.

[Other Configurations of Pixels]

Figure 17A:
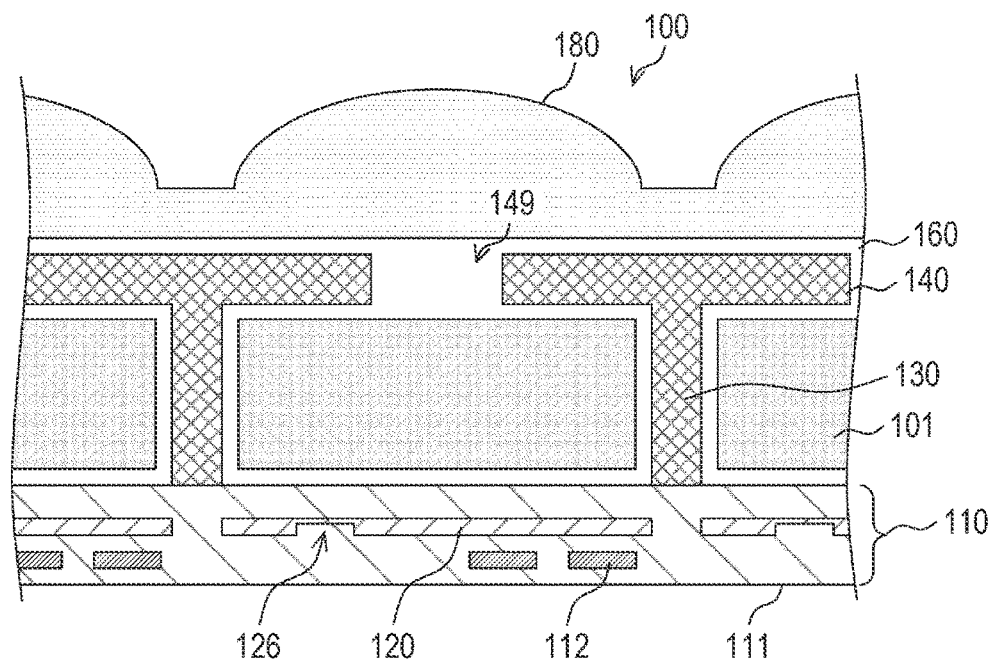
FIGS. 17A and 17B are cross-sectional diagrams showing other example configurations of pixels according to the seventh embodiment of the present disclosure.
Figure 17B:
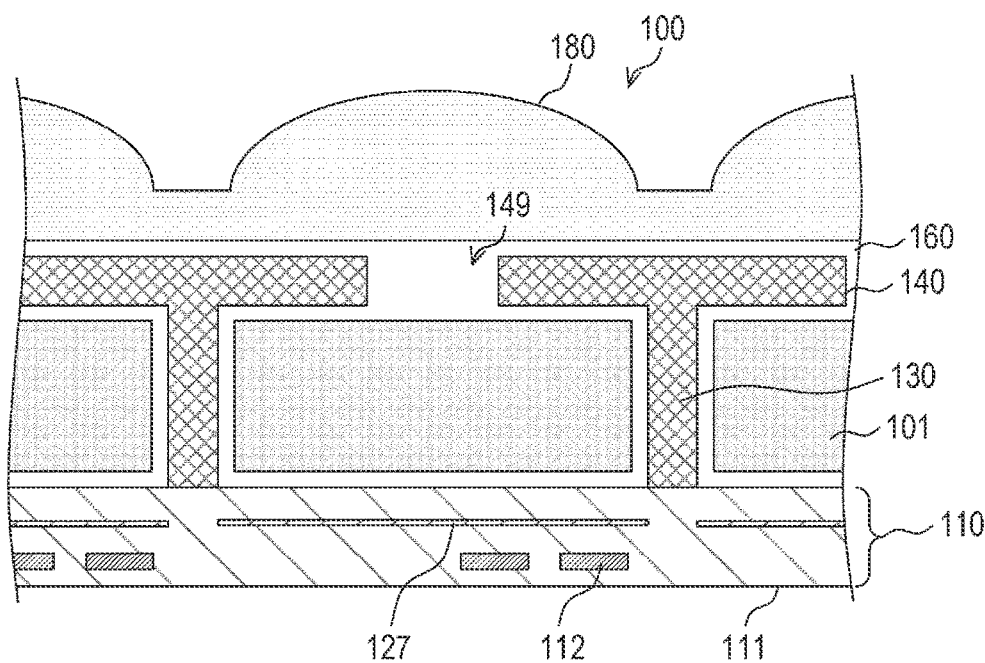
Figure 18:
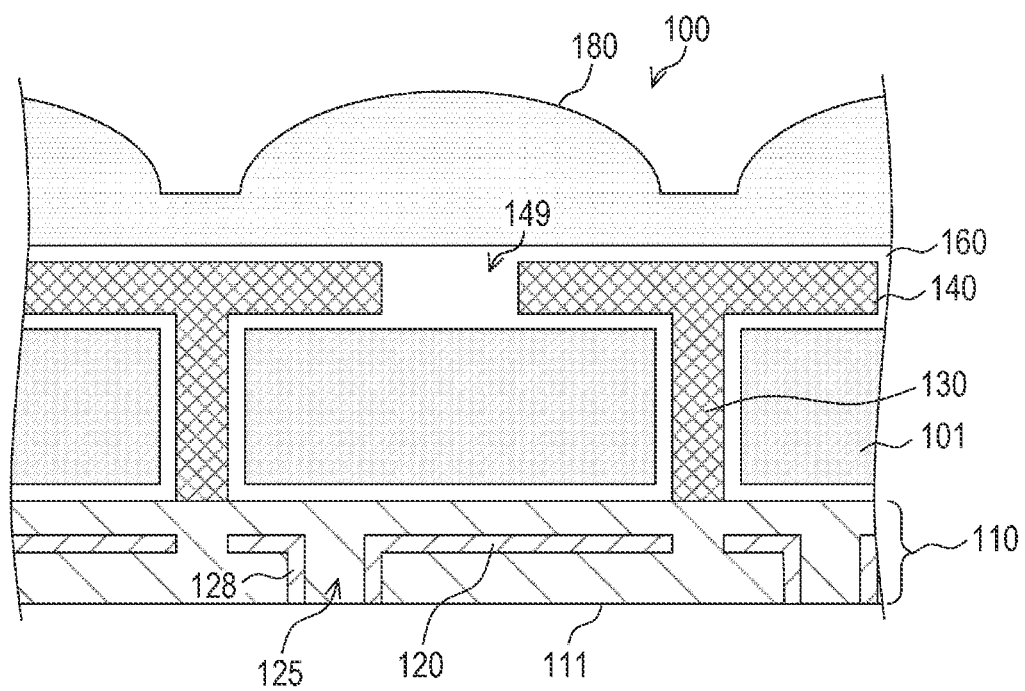
FIG. 18 is a cross-sectional diagram showing another example configuration of a pixel according to the seventh embodiment of the present disclosure.

FIGS. 17A, 17B, and 18 are cross-sectional diagrams showing other example configurations of pixels according to the seventh embodiment of the present disclosure. FIG. 17A is a diagram showing a reflection adjustment portion 126 that is formed with a recess formed in the front-surface-side reflective film 120. As this recess is formed, the front-surface-side reflective film 120 at the corresponding portion becomes thinner, and more of the transmitted light entering the front-surface-side reflective film 120 can pass through the front-surface-side reflective film 120. It is possible to form the reflection adjustment portion 126 by omitting part of the front-surface-side reflective film 120 formed in multiple layers, for example. Specifically, in a case where the front-surface-side reflective film 120 is formed with a barrier layer, a seed layer for plating, and a Cu layer that are similar to the wiring layer 112, the Cu layer is omitted so that the reflection adjustment portion 126 can be formed.

FIG. 17B is a diagram showing an example of a front-surface-side reflective film 127 formed with a thinned metal film. More of the transmitted light entering the front-surface-side reflective film 127 can pass through the front-surface-side reflective film 127. Note that the front-surface-side reflective film 127 is an example of the reflection adjustment portion disclosed in the claims.

FIG. 18 is a diagram showing an example of a reflection adjustment portion 125 including a waveguide 128. The waveguide 128 is formed in a cylindrical shape surrounding the reflection adjustment portion 125, and guides the transmitted light that has passed through the reflection adjusting portion 125 to the outside of the wiring region 110. As the waveguide 128 is provided, the transmitted light reflected by the wiring region 110 or the like can be prevented from entering the reflection adjustment portion 125.

The other components of the imaging device 1 are similar to the components of the imaging device 1 described in the first embodiment of the present disclosure, and therefore, explanation of them is not made herein.

As described above, the imaging device 1 according to the seventh embodiment of the present disclosure has the reflection adjustment portion to adjust reflection of transmitted light at the front-surface-side reflective film 120. With this arrangement, the sensitivity of the pixel 100 can be adjusted.

8. Eighth Embodiment

In the imaging device 1 of the first embodiment described above, incident light of all wavelengths enters the photoelectric conversion units of the pixels 100. On the other hand, an imaging device 1 according to an eighth embodiment of the present disclosure differs from the above-described first embodiment in that a color filter is provided in a pixel 100 to select incident light.

[Configuration of Pixels]

Figure 19:
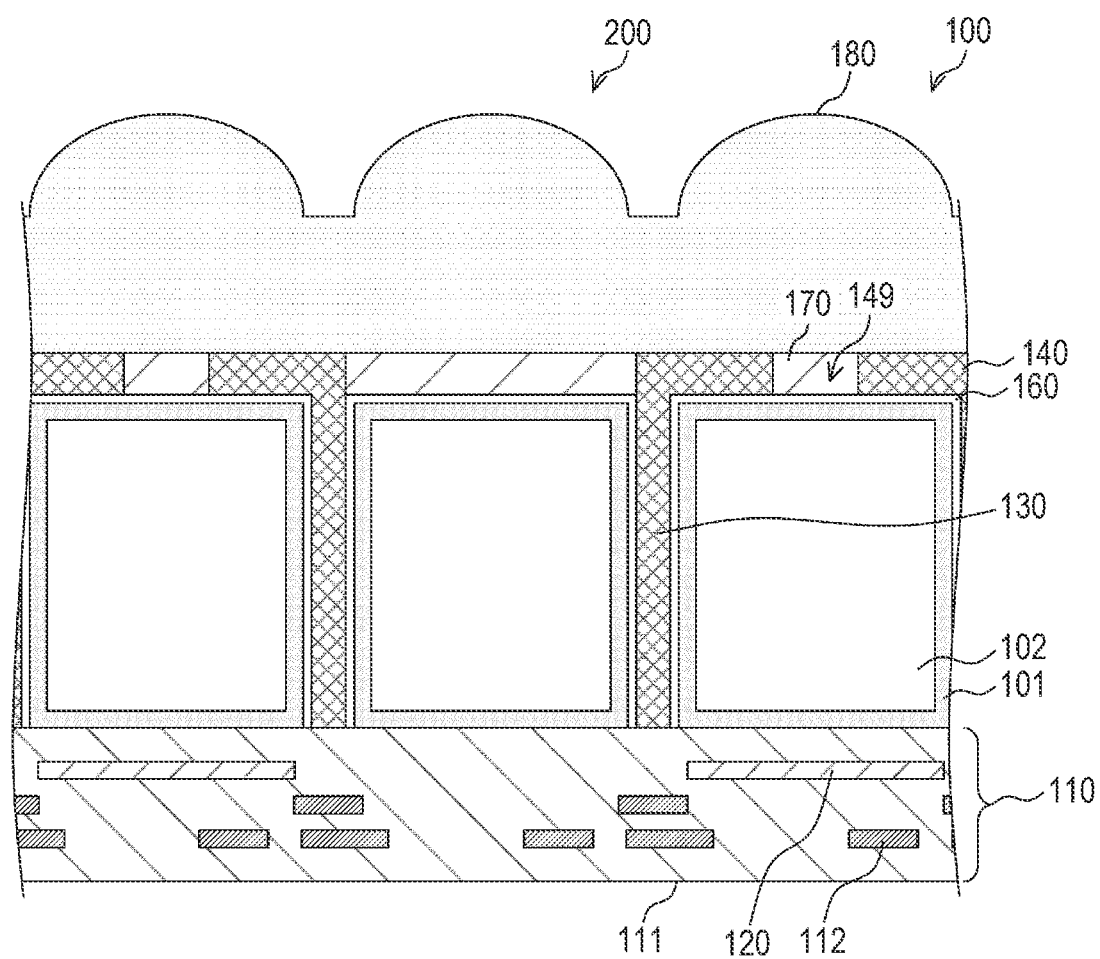
FIG. 19 is a cross-sectional diagram showing an example configuration of pixels according to an eighth embodiment of the present disclosure.

FIG. 19 is a cross-sectional diagram showing an example configuration of pixels according to the eighth embodiment of the present disclosure. Like FIG. 2, this drawing is a cross-sectional diagram showing an example configuration of pixels. The imaging device differs from the imaging device described with reference to FIG. 2 in including a pixel 100 having a color filter 170 and further including a pixel 200.

The pixel 100 in the drawing includes a color filter 170. The color filter 170 is an optical filter that transmits incident light having a predetermined wavelength in entire incident light. As the color filter 170, a color filter 170 that transmits red light, green light, and blue light can be used, for example. In the pixel 100, a color filter 170 corresponding to any one of these colors can be provided. The pixel 100 in the drawing shows an example in which the color filter 170 is disposed in the opening 149 of the back-surface-side reflective film 140. The on-chip lens 180 in the drawing condenses incident light onto the photoelectric conversion unit via the color filter 170. The photoelectric conversion unit generates an image signal of incident light having a wavelength with which the color filter 170 is compatible. By adopting the pixels 100 including the color filters 170, it is possible to obtain a color image. Further, a color filter that transmits infrared light can be adopted as a color filter 170.

Note that a color filter 170 that transmits incident light having a relatively long wavelength can be adopted as the color filter 170 of a pixel 100. Specifically, a color filter 170 that transmits infrared light and red light can be provided in a pixel 100. Incident light having a relatively long wavelength such as infrared light and red light is hardly absorbed by the semiconductor substrate 101, and thus, reaches a deep portion in the semiconductor substrate 101. In a case where the thickness of the semiconductor substrate 101 is small as in the back-illuminated imaging device 1 shown in the drawing, incident light having a long wavelength passes through the semiconductor substrate 101, and reflected light is easily generated. Therefore, in such a pixel 100, the back-surface-side reflective film 140 and front-surface-side reflective film 120 described above are provided to reduce reflected light.

The pixel 200 is a pixel that includes a color filter 170 but excludes the back-surface-side reflective film 140 and the front-surface-side reflective film 120. The color filter 170 is disposed in the region of the back-surface-side reflective film 140. A color filter 170 that transmits incident light having a relatively short wavelength can be provided as the color filter 170 of the pixel 200. Specifically, a color filter 170 that transmits green light and blue light can be provided in the pixel 100. Incident light having a relatively short wavelength, such as green light and blue light, is easily absorbed by the semiconductor substrate 101, and the rate at which transmitted light passing through the semiconductor substrate 101 is generated is low. Accordingly, the back-surface-side reflective film 140 and the front-surface-side reflective film 120 can be omitted from the pixel 200 in which the color filter 170 compatible with green light and blue light is provided.

Further, as shown in the drawing, the color filters 170 are provided in the same layer as the back-surface-side reflective film 140 in the pixels 100 and 200, and thus, an increase in the height of the imaging device 1 can be prevented.

[Other Configurations of Pixels]

Figure 20:
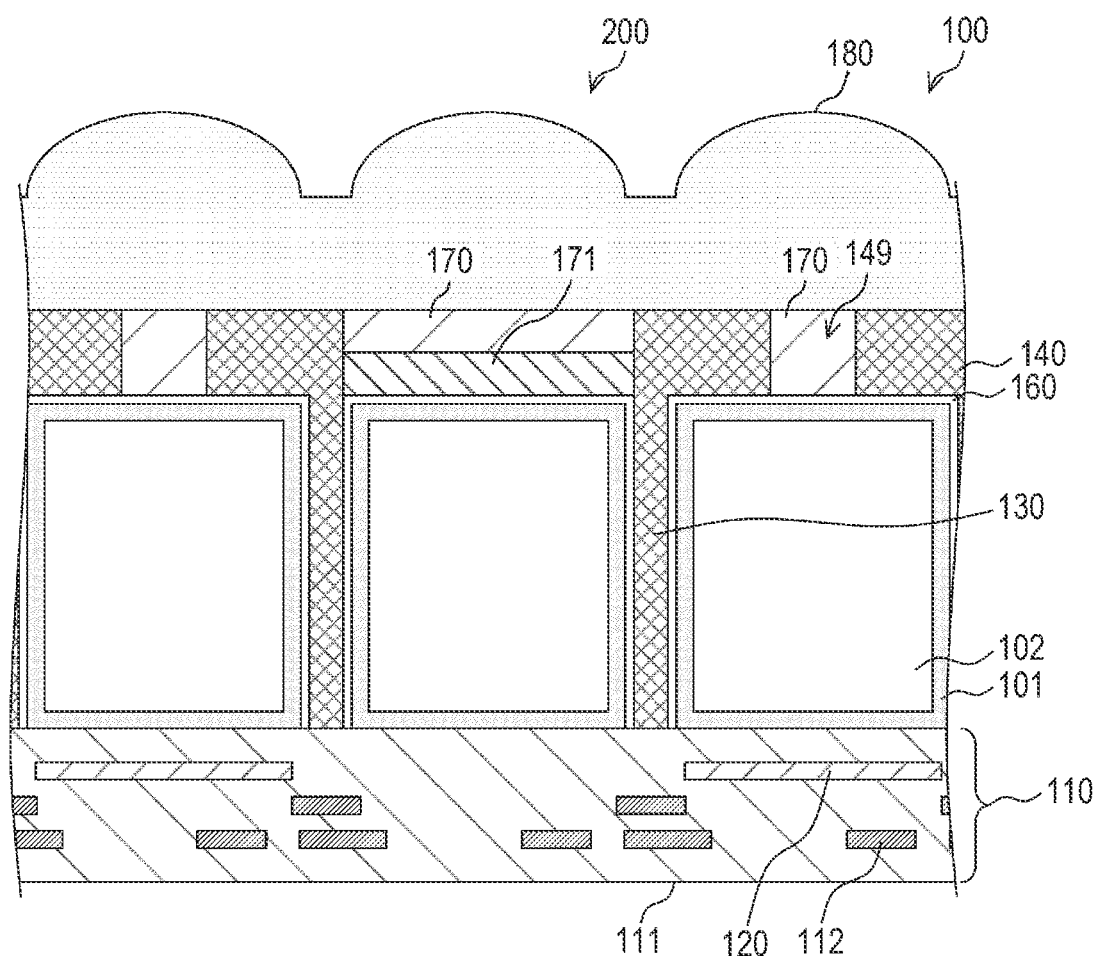
FIG. 20 is a cross-sectional diagram showing another example configuration of pixels according to the eighth embodiment of the present disclosure.

FIG. 20 is a cross-sectional diagram showing another example configuration of pixels according to the eighth embodiment of the present disclosure. A pixel 200 in the drawing differs from the pixel 200 described with reference to FIG. 19 in including an infrared light blocking filter 171.

The infrared light blocking filter 171 is a filter that blocks infrared light in incident light. As the infrared light blocking filter 171 is provided in the pixel 200, it is possible to remove the infrared light component from an image signal from the pixel 200, and generate an image signal based on visible light. Noise of an image signal of visible light can be reduced.

Note that the configuration of the imaging device 1 is not limited to this example. For example, the back-surface-side reflective film 140 and the front-surface-side reflective film 120 may be provided in all the pixels.

The other components of the imaging device 1 are similar to the components of the imaging device 1 described in the first embodiment of the present disclosure, and therefore, explanation of them is not made herein.

As described above, including the color filters 170, the imaging device 1 according to the eighth embodiment of the present disclosure can output a color image signal.

9. Ninth Embodiment

In the imaging device 1 of the first embodiment described above, the opening 149 of the back-surface-side reflective film 140 is located at the central portion of the pixel 100. On the other hand, an imaging device 1 according to a ninth embodiment of the present disclosure differs from the above-described first embodiment in that the position and the shape of the opening 149 are adjusted in accordance with the incident angle of incident light.

[Configuration of a Pixel]

Figure 21A:
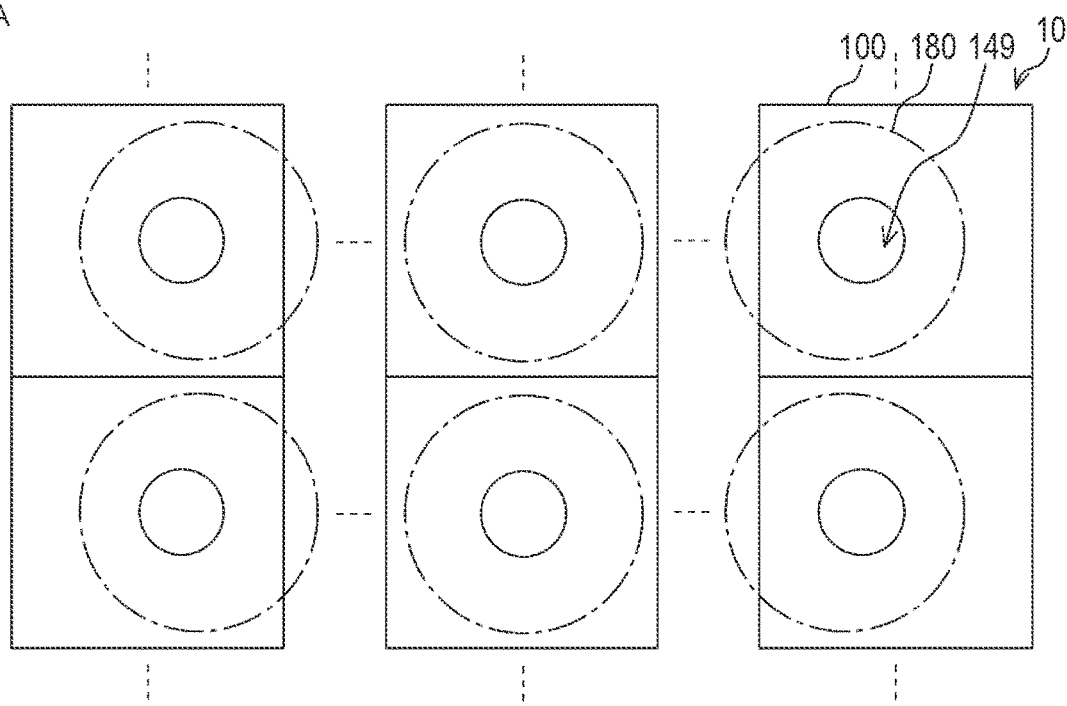
FIGS. 21A and 21B are diagrams showing example configurations of pixels according to a ninth embodiment of the present disclosure.
Figure 21B:
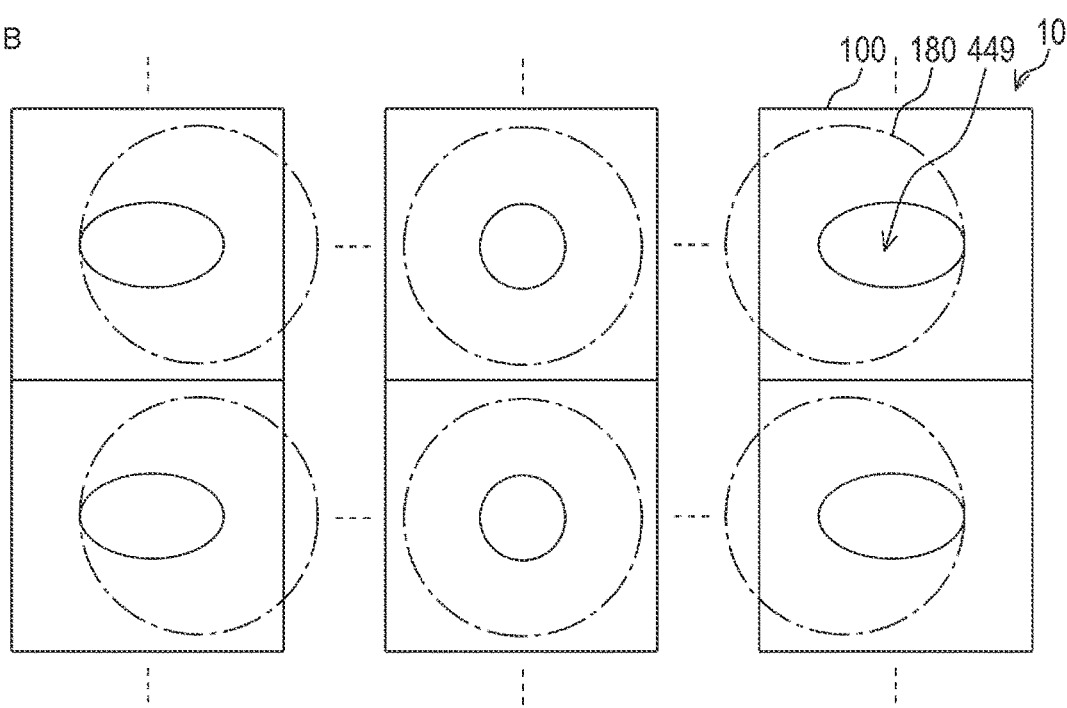

FIGS. 21A and 21B are diagrams showing example configurations of pixels according to the ninth embodiment of the present disclosure. Like FIGS. 3A and 3B, this drawing is top views showing example configurations of pixels 100. The pixels 100 differ from the pixels 100 described with reference to FIGS. 3A and 3B in including pixels 100 among which the position of the on-chip lens 180, the position of the opening 149 of the back-surface-side reflective film 140, and the like vary.

The drawing is diagrams showing pixels 100 that are arranged at the right and left edges and at the centers of the rows in the central portion of the pixel array unit 10 described with reference to FIG. 1. In FIG. 21A in the drawing, the pixels 100 arranged in the central portion of the pixel array unit 10 can have a configuration similar to that of the pixels 100 described with reference to FIGS. 3A and 3B. In the pixels 100 arranged at the edges, on the other hand, the on-chip lenses 180 are shifted toward the central portion of the pixel array unit 10. Likewise, the openings 149 of the back-surface-side reflective film 140 are also shifted toward the central portion of the pixel array unit 10.

An image of the object is formed on the pixel array unit 10 of the imaging device 1 by an imaging lens or the like. At this point of time, light from the object almost perpendicularly enters the pixels 100 in the central portion of the pixel array unit 10. On the other hand, light from the object obliquely enters the pixels 100 in the peripheral portions of the pixel array unit 10. Therefore, a difference is caused between the condensing positions of the incident light condensed by the on-chip lenses 180 and the positions of the photoelectric conversion units, and the sensitivity drops. To counter this, the on-chip lenses 180 are shifted in accordance with the incident angle of incident light, so that the light condensing positions can be adjusted. Such adjustment of the positions of the on-chip lenses 180 is called pupil correction. Like the on-chip lenses 180, the openings 149 of the back-surface-side reflective film 140 are also shifted in accordance with the incident angle of incident light. With this arrangement, vignetting of incident light for which the condensing positions are adjusted can be prevented.

FIG. 21B in the drawing is a diagram showing an example case where openings 449, instead of the openings 149, are formed in in the back-surface-side reflective film 140. The pixels 100 in FIG. 21B in the drawing have the openings 449 whose shapes are adjusted in accordance with the incident angle of incident light. Specifically, the openings 449 of the pixels 100 arranged in the peripheral portions of the pixel array unit 10 are each formed in an elliptical shape extending in a direction toward the central portion of the pixel array unit 10. With this arrangement, vignetting of incident light that obliquely enters can be prevented.

Note that the configuration of the imaging device 1 is not limited to this example. For example, the rectangular opening 149 described with reference to FIG. 3B can also be adopted. In that case, the positions and the shapes of the rectangular openings 149 are adjusted in accordance with the incident angle of incident light.

The other components of the imaging device 1 are similar to the components of the imaging device 1 described in the first embodiment of the present disclosure, and therefore, explanation of them is not made herein.

As described above, the imaging device 1 according to the ninth embodiment of the present disclosure can prevent a decrease in the sensitivity of the pixels 100 in the peripheral portions of the pixel array unit 10, by performing pupil correction.

10. Tenth Embodiment

The imaging device 1 of the first embodiment described above includes the back-surface-side reflective film 140 and the front-surface-side reflective film 120, to reflect transmitted light that has passed through the semiconductor substrate 101. On the other hand, an imaging device 1 of a tenth embodiment of the present disclosure differs from the above-described first embodiment in further including an absorption film that absorbs reflected transmitted light.

[Configuration of a Pixel]

Figure 22:
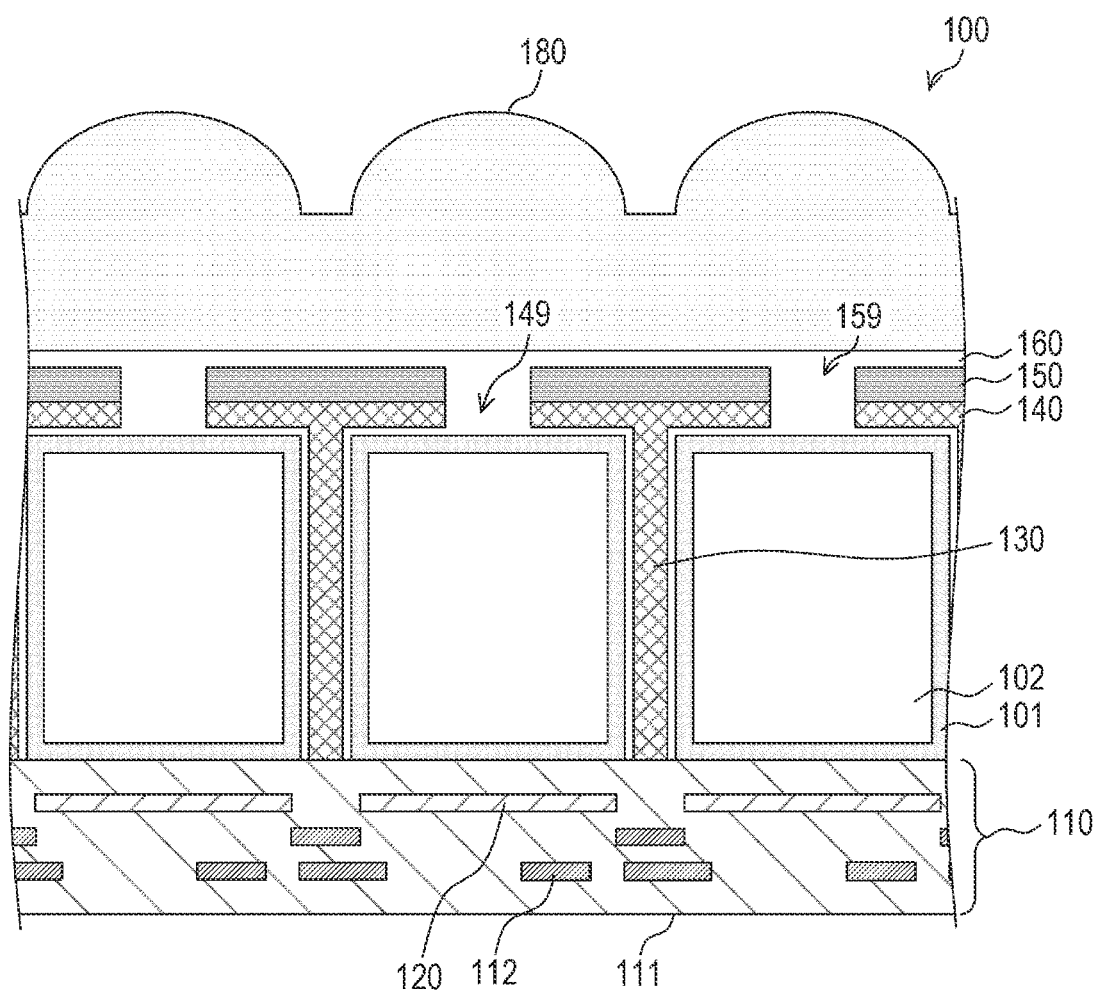

FIG. 22 is a cross-sectional diagram showing an example configuration of a pixel according to the tenth embodiment of the present disclosure. Like FIG. 2, this drawing is a cross-sectional diagram showing an example configuration of a pixel 100. The pixel 100 differs from the pixel 100 described with reference to FIG. 2 in further including an absorption film 150.

The absorption film 150 is disposed on the back surface of the semiconductor substrate 101, to transmit incident light from the object and absorb reflected light. The absorption film 150 has an opening 159 in the central portion, and, through the opening 159, transmits incident light condensed by the on-chip lens 180. The absorption film 150 also absorbs reflected light, to reduce leakage of the reflected light to the outside of the pixel 100. The absorption film 150 in the drawing is disposed between the on-chip lens 180 and the back-surface-side reflective film 140, and absorbs reflected light that has passed through the opening 149 of the back-surface-side reflective film 140. The absorption film 150 can be formed with a film in which an absorbing material that absorbs incident light is dispersed, for example. For example, a pigment that absorbs light, such as carbon black or titanium oxide, is used as the absorbing material, and the absorption film 150 can be formed with a film in which the pigment is dispersed in resin or the like. Such an absorption film 150 can be manufactured in the following manner: a resin film having a pigment dispersed therein is formed adjacent to the back-surface-side reflective film 140, and the opening 159 is then formed. Note that the opening 159 can be formed by dry etching, or by wet etching using a chemical solution. Note that an absorption film 150 containing a dye-based absorbing material such as an infrared absorber can also be used.

As the absorption film 150 is provided, reflected light and incident light obliquely passing through the opening 149 of the back-surface-side reflective film 140 can be made to enter the wall surface of the absorption film 150 in the opening 159 and be absorbed.

The other components of the imaging device 1 are similar to the components of the imaging device 1 described in the first embodiment of the present disclosure, and therefore, explanation of them is not made herein.

As described above, the imaging device 1 according to the tenth embodiment of the present disclosure includes the absorption film 150 and absorbs reflected light passing through the back-surface-side reflective film 140, so that reflected light releasing to the outside of the pixel 100 can be reduced. The occurrence of flare and the like can be prevented, and image quality can be further improved.

11. Eleventh Embodiment

The imaging device 1 of the first embodiment described above includes a photoelectric conversion unit formed with a photodiode. On the other hand, an imaging device 1 according to an eleventh embodiment of the present disclosure differs from the above-described first embodiment in including a photoelectric conversion unit formed with an avalanche photodiode.

[Configuration of a Pixel]

Figure 23:
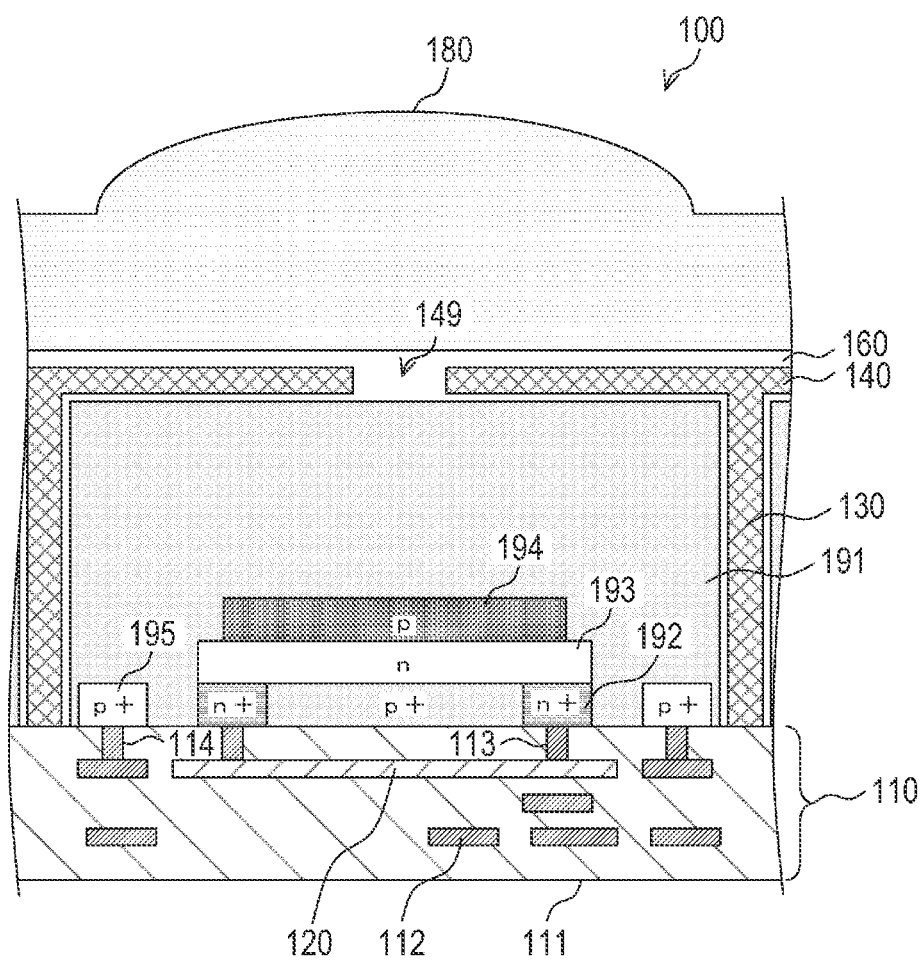

FIG. 23 is a cross-sectional diagram showing an example configuration of a pixel according to the eleventh embodiment of the present disclosure. Like FIG. 2, this drawing is a cross-sectional diagram showing an example configuration of a pixel 100. The pixel 100 differs from the pixel 100 described with reference to FIG. 2 in that a photoelectric conversion unit formed with an avalanche photodiode, instead of a photodiode, is formed in a semiconductor substrate.

The pixel 100 in the drawing includes a semiconductor substrate 191. The semiconductor substrate 191 forms a well region having a low impurity concentration. A photoelectric conversion unit formed with an avalanche photodiode is formed in the semiconductor substrate 191. An avalanche photodiode is a photodiode that includes a p-n junction region and a low-impurity-concentration region therein, and performs photoelectric conversion while a high reverse voltage is applied to the p-n junction portion. A higher voltage than the breakdown voltage is set as the reverse voltage to be applied, so that the electric charges generated by photoelectric conversion in the low-impurity-concentration region are amplified by avalanche multiplication caused by the intense electric field of the p-n junction portion. Highly-sensitive photodetection at high speed becomes possible.

The photoelectric conversion unit in the drawing includes a well region (the semiconductor substrate 191), an n-type semiconductor region 193, a p-type semiconductor region 194, an n-type contact region 192, and a p-type contact region 195. The n-type semiconductor region 193 and the p-type semiconductor region 194 are formed in the well region, and constitute the above-described p-n junction. The n-type contact region 192 is formed in the front surface of the semiconductor substrate 191, and is located adjacent to the n-type semiconductor region 193. The p-type contact region 195 is formed in the front surface of the semiconductor substrate 191, and is located adjacent to the well region. The p-type contact region 195 and the n-type contact region 192 are semiconductor regions that are designed to have a relatively high impurity concentration, and have the later-described electrodes 113 and 114 connected thereto, respectively. Note that the well region in the front surface of the semiconductor substrate 191 is designed to have a relatively high impurity concentration, and the surface level can be pinned.

The electrodes 113 and 114 are electrodes for applying signal voltages to the semiconductor regions of the photoelectric conversion unit. The electrodes 113 and 114 correspond to an anode and a cathode, respectively.

As described above, the photoelectric conversion unit in the drawing is formed with an avalanche photodiode, and a reverse voltage is applied thereto. Specifically, a bias voltage that is higher in the electrode 113 than in the electrode 114 is applied. As a result, an intense electric field region is formed in the p-n junction region formed with the n-type semiconductor region 193 and the p-type semiconductor region 194. On the other hand, the well region has a relatively low electric field. When incident light enters from the back surface side of the semiconductor substrate 191 and causes photoelectric conversion in the well region, the electric charges generated by the photoelectric conversion move on the basis of the electric field of the well region. Of the electric charges, the electrons move from the well region to the p-type semiconductor region 194, and are accelerated by the intense electric field of the p-n junction region, to produce an electron avalanche. Due to the electric charges multiplied by this electron avalanche, a large electric current flows between the electrodes 113 and 114, to cause an amplification effect.

In the wiring region 110, the wiring layer 112 and the front-surface-side reflective film 120 are disposed. The above-described electrode 114 is connected to the wiring layer 112, and the electrode 113 is connected to the front-surface-side reflective film 120. The front-surface-side reflective film 120 functions as a wiring line that reflects transmitted light and transmits signals to the electrode 113.

As the imaging device 1 including a photoelectric conversion unit formed with such an avalanche photodiode has a high sensitivity, the imaging device 1 can be used in a distance measuring sensor that measures the distance to an object. The distance measuring sensor includes the imaging device 1 and a light source that emits infrared light. The distance measurement by the distance measuring sensor can be performed as follows. First, the light source emits infrared light onto the object. Next, the imaging device 1 detects the infrared light reflected by the object. The time from the emission of the infrared light till the detection of the infrared light by the imaging device 1 is measured, so that the distance to the object can be calculated. Such distance measurement is called the time-of-flight (ToF) method.

In the pixel 100 in the drawing, the back-surface-side reflective film 140 and the front-surface-side reflective film 120 are also provided, so that transmitted light and reflected light that have passed through the semiconductor substrate 191 can be confined therein. Reflected light leaking to the outside of the imaging device 1 including the photoelectric conversion unit formed with an avalanche photodiode can be reduced.

Note that the configuration of the imaging device 1 is not limited to this example. For example, the front-surface-side reflective film 120 may be disposed adjacent to the n-type contact region 192, and the front-surface-side reflective film 120 may be used as an electrode.

The other components of the imaging device 1 are similar to the components of the imaging device 1 described in the first embodiment of the present disclosure, and therefore, explanation of them is not made herein.

As described above, in the imaging device 1 according to the eleventh embodiment of the present disclosure, reflected light leaking to the outside of the imaging device 1 including a photoelectric conversion unit formed with an avalanche photodiode can be reduced, and image quality degradation can be prevented.

12. Twelfth Embodiment

The imaging device 1 of the first embodiment described above includes the semiconductor substrate 101. On the other hand, an imaging device 1 according to a twelfth embodiment of the present disclosure differs from the above-described first embodiment in further including an organic photoelectric conversion film.

[Configuration of Pixels]

Figure 24:
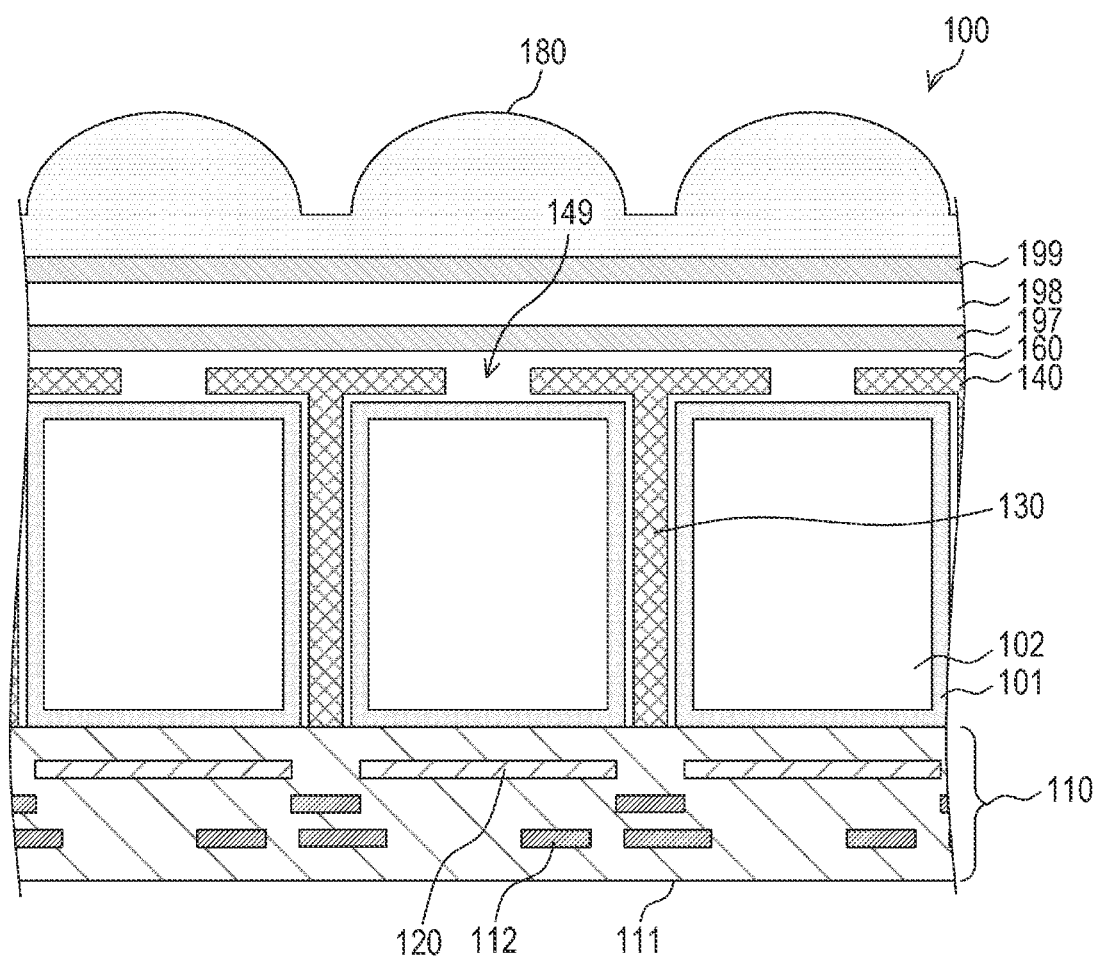

FIG. 24 is a cross-sectional diagram showing an example configuration of a pixel according to the twelfth embodiment of the present disclosure. Like FIG. 2, this drawing is a cross-sectional diagram showing an example configuration of a pixel 100. The pixel 100 differs from the pixel 100 described with reference to FIG. 2 in further including an organic photoelectric conversion film 198 and transparent electrodes 197 and 199.

The organic photoelectric conversion film 198 is a photoelectric conversion film formed with an organic material. For the organic photoelectric conversion film 198, a film formed with subphthalocyanine can be used, for example. The transparent electrodes 197 and 199 are films that have conductivity and transmit incident light. The transparent electrodes 197 and 199 can be formed with indium tin oxide (ITO), for example. The organic photoelectric conversion film 198 is interposed between the transparent electrodes 197 and 199. A signal based on the electric charges generated by photoelectric conversion in the organic photoelectric conversion film 198 is output via the transparent electrodes 197 and 199. The pixel 100 in the drawing has a configuration in which the organic photoelectric conversion film 198 and the transparent electrodes 197 and 199 are disposed between the on-chip lens 180 and the protective film 160.

The organic photoelectric conversion film 198 can be designed to perform photoelectric conversion by absorbing visible light of incident light, for example. In this case, the photoelectric conversion unit of the semiconductor substrate 101 of the lower layer performs photoelectric conversion on infrared light. Alternatively, the organic photoelectric conversion film 198 may perform photoelectric conversion on green light and blue light, and the photoelectric conversion unit of the semiconductor substrate 101 may perform photoelectric conversion on red light. In this manner, an image signal based on incident lights of different wavelengths can be generated in one pixel 100.

In the pixel 100 in the drawing, the back-surface-side reflective film 140 and the front-surface-side reflective film 120 are also provided, so that transmitted light and reflected light that have passed through the semiconductor substrate 101 can be confined therein. Reflected light leaking to the outside of the imaging device 1 including the organic photoelectric conversion film 198 can be reduced.

[Another Configuration of a Pixel]

Figure 25:
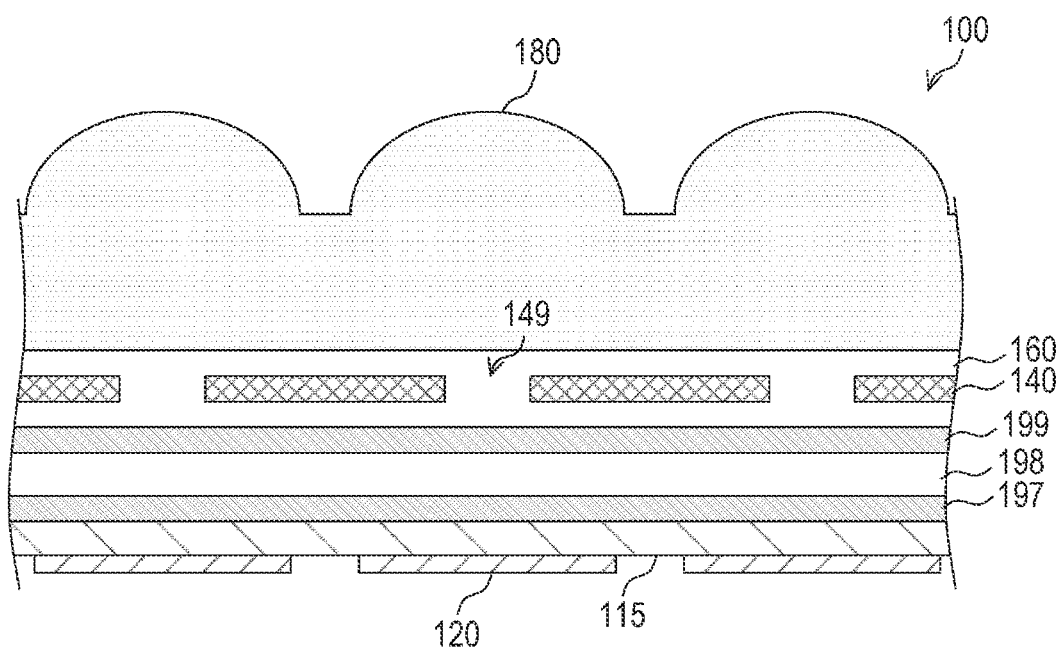

FIG. 25 is a cross-sectional diagram showing another example configuration of a pixel according to the twelfth embodiment of the present disclosure. Like FIG. 24, this drawing is a cross-sectional diagram showing an example configuration of a pixel 100 including an organic photoelectric conversion film 198. The pixel 100 differs from the pixel 100 described with reference to FIG. 24 in that a glass substrate 115 having an organic photoelectric conversion film 198 stacked thereon is provided, instead of the semiconductor substrate 101.

The glass substrate 115 is a substrate formed with glass. On the back surface side of the glass substrate 115, a transparent electrode 197, the organic photoelectric conversion film 198, and a transparent electrode 199 are stacked in this order, and the protective film 160 and the back-surface-side reflective film 140 are placed thereon. The front-surface-side reflective film 120 is disposed on the front surface side of the glass substrate 115. After that, the on-chip lens 180 is disposed on the back surface side of the glass substrate 115, and thus, the pixel 100 is formed. Note that the glass substrate 115 is an example of the substrate disclosed in the claims.

The other components of the imaging device 1 are similar to the components of the imaging device 1 described in the first embodiment of the present disclosure, and therefore, explanation of them is not made herein.

As described above, in the imaging device 1 according to the twelfth embodiment of the present disclosure, reflected light leaking to the outside of the imaging device 1 including the organic photoelectric conversion film 198 can be reduced, and image quality degradation can be prevented.

Note that the configuration of the back-surface-side reflective film of the second embodiment of the present disclosure can be applied to other embodiments. Specifically, the back-surface-side reflective film 140 described with reference to FIGS. 7A and 7B can be applied to the pixels 100 shown in FIGS. 8, 12, 13A, 13B, 14, 15, 16A, 16B, 16C, 17A, 17B, 18, 19, 20, 21A, 21B, 22, 23, 24, and 25.

The substrate-back-surface scattering portion of the third embodiment of the present disclosure can be applied to other embodiments. Specifically, the substrate-back-surface scattering portion 109 described with reference to FIG. 8 can be applied to the pixels 100 shown in FIGS. 7A, 7B, 12, 13A, 13B, 14, 15, 16A, 16B, 16C, 17A, 17B, 18, 19, 20, 21A, 21B, 22, 23, 24, and 25.

The substrate reflective portion of the fourth embodiment of the present disclosure can be applied to other embodiments. Specifically, the substrate reflective portions 104 to 108 described with reference to FIGS. 9A, 9B, 10A, 10B, 11A, and 11B can be applied to the pixels 100 shown in FIGS. 7A, 7B, 12, 13A, 13B, 14 15, 16A, 16B, 16C, 17A, 17B, 18, 19, 20, 21A, 21B, 22, 23, 24, and 25.

The substrate-front-surface scattering portion of the fifth embodiment of the present disclosure can be applied to other embodiments. Specifically, the substrate-front-surface scattering portions 121 and 123, and the wall portion 122 described with reference to FIG. 12 can be applied to the pixels 100 shown in FIGS. 7A, 7B, 8, 9A, 9B, 10A, 10B, 11A, 11B, 14, 15, 16A, 16B, 16C, 17A, 17B, 18, 19, 20, 21A, 21B, 22, 23, 24, and 25.

The substrate-front-surface scattering portion 103 of the sixth embodiment of the present disclosure can be applied to other embodiments. Specifically, the substrate-front-surface scattering portion 103 described with reference to FIG. 14 can be applied to the pixels 100 shown in FIGS. 7A, 7B, 8, 9A, 9B, 10A, 10B, 11A, 11B, 12, 13A, 13B, 15, 16A, 16B, 16C, 17A, 17B, 18, 19, 20, 21A, 21B, 22, 23, 24 and 25.

The reflection adjustment portion of the seventh embodiment of the present disclosure can be applied to other embodiments. Specifically, the reflection adjustment portions 125 and 126, the front-surface-side reflective film 127 and the waveguide 128 described with reference to FIGS. 15, 16A, 16B, 16C, 17A, 17B, and 18 can be applied to the pixels 100 shown in FIGS. 7A, 7B, 8, 9A, 9B, 10A, 10B, 11A, 11B, 12, 13A, 13B, 19, 20, 21A, 21B, 22, 23, 24, and 25.

The color filters of the eighth embodiment of the present disclosure can be applied to other embodiments. Specifically, the color filters 170 described with reference to FIGS. 19 and 20 can be applied to the pixels 100 shown in FIGS. 7A, 7B, 8, 9A, 9B, 10A, 10B, 11A, 11B, 12, 13A, 13B, 14, 15, 16A, 16B, 16C, 17A, 17B 18, 21A, 21B, 22, 23, 24, and 25.

The configuration of the pixels of the ninth embodiment of the present disclosure can be applied to other embodiments. Specifically, the on-chip lens 180 and the opening 149 described with reference to FIGS. 21A and 21B can be applied to the pixels 100 shown in Figs. FIGS. 7A, 7B, 8, 9A, 9B, 10A, 10B, 11A, 11B, 12, 13A, 13B, 14, 15, 16A, 16B, 16C, 17A, 17B, 18, 19, 20, 22, 23, 24, and 25.

The absorption film of the tenth embodiment of the present disclosure can be applied to other embodiments. Specifically, the absorption film 150 described with reference to FIG. 22 can be applied to the pixels 100 shown in FIGS. 7A, 7B, 8, 9A, 9B, 10A, 10B, 11A, 11B, 12, 13A, 13B, 14, 15, 16A, 16B, 16C, 17A, 17B, 18, 19, 20, 21A, 21B, 23, 24, and 25.

13. Example Application to a Camera

The technology (the present technology) according to the present disclosure can be applied to various products. For example, the present technology may be embodied as an imaging device mounted in an imaging apparatus such as a camera.

Figure 26:
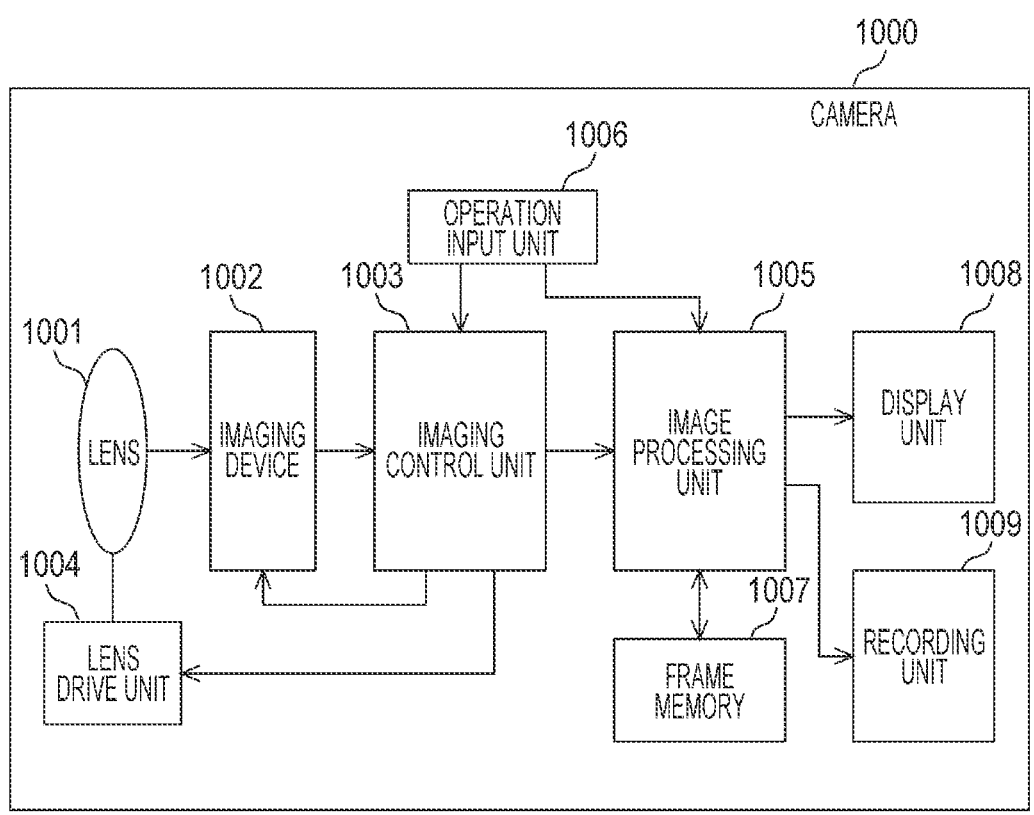

FIG. 26 is a block diagram showing a schematic example configuration of a camera that is an example of an imaging apparatus to which the present technology can be applied. A camera 1000 in the drawing includes a lens 1001, an imaging device 1002, an imaging control unit 1003, a lens drive unit 1004, an image processing unit 1005, an operation input unit 1006, a frame memory 1007, a display unit 1008, and a recording unit 1009.

The lens 1001 is the imaging lens of the camera 1000. The lens 1001 condenses light from the object, and causes the light to enter the imaging device 1002 described later, to form an image of the object.

The imaging device 1002 is a semiconductor element that images the light that has come from the object and been condensed by the lens 1001. The imaging device 1002 generates an analog image signal corresponding to the emitted light, converts the analog image signal into a digital image signal, and outputs the digital image signal.

The imaging control unit 1003 controls imaging in the imaging device 1002. The imaging control unit 1003 generates a control signal and outputs the control signal to the imaging device 1002, to control the imaging device 1002. The imaging control unit 1003 can also perform autofocusing in the camera 1000 on the basis of an image signal output from the imaging device 1002. Here, autofocusing is a system that detects the focal position of the lens 1001 and automatically adjusts the focal position. The autofocusing can be a method (image plane phase difference autofocusing) for detecting a focal position by detecting an image plane phase difference with a phase difference pixel disposed in the imaging device 1002. It is also possible to use a method (contrast autofocusing) for detecting a focal position that is the position at which the contrast of an image is the highest. The imaging control unit 1003 adjusts the position of the lens 1001 via the lens drive unit 1004 on the basis of the detected focal position, and performs autofocusing. Note that the imaging control unit 1003 can be formed with a digital signal processor (DSP) equipped with firmware, for example.

The lens drive unit 1004 drives the lens 1001, under the control of the imaging control unit 1003. The lens drive unit 1004 can drive the lens 1001 by changing the position of the lens 1001, using a built-in motor.

The image processing unit 1005 processes image signals generated by the imaging device 1002. This processing may be demosaicing for generating an image signal of an insufficient color among image signals corresponding to red, green, and blue for each pixel, noise reduction for removing noise in image signals, encoding of image signals, and the like, for example. The image processing unit 1005 can be formed with a microcomputer equipped with firmware, for example.

The operation input unit 1006 receives an operation input from the user of the camera 1000. As the operation input unit 1006, push buttons or a touch panel can be used, for example. An operation input received by the operation input unit 1006 is transmitted to the imaging control unit 1003 and the image processing unit 1005. After that, processing according to the operation input, such as imaging of the object, is started, for example.

The frame memory 1007 is a memory storing a frame that is the image signals of one screen. The frame memory 1007 is controlled by the image processing unit 1005, and holds a frame being subjected to image processing.

The display unit 1008 displays an image processed by the image processing unit 1005. For example, a liquid crystal panel can be used as the display unit 1008.

The recording unit 1009 records an image processed by the image processing unit 1005. For example, a memory card or a hard disk can be used as the recording unit 1009.

A camera to which the present disclosure can be applied has been described above. The present technology can be applied to the imaging device 1002 in the configuration described above. Specifically, the imaging device 1 described with reference to FIG. 1 can be applied to the imaging device 1002. By applying the imaging device 1 to the imaging device 1002, it is possible to reduce reflected light, and prevent degradation of the quality of an image generated by the camera 1000. Note that the image processing unit 1005 is an example of the processing circuit disclosed in the claims. The camera 1000 is an example of the photoelectric conversion device disclosed in the claims.

Note that, although a camera has been described as an example herein, the technology according to the present disclosure may also be applied to a distance sensor or the like, for example. Further, the present disclosure can also be applied to a semiconductor device in the form of a semiconductor module, in addition to electronic apparatuses such as a camera. Specifically, the technology according to the present disclosure can also be applied to an imaging module that is a semiconductor module in which the imaging device 1002 and the imaging control unit 1003 in FIG. 26 are contained in one package.

Lastly, the explanation of each embodiment described above is an example of the present disclosure, and the present disclosure is not limited to the embodiments described above. Accordingly, other than the respective embodiments described above, various changes may of course be made depending on the design and the like, without departing from the technical idea according to the present disclosure.

Further, the effects described in this specification are merely examples, and do not limit the effects of the technology. There may also be other effects.

Also, the drawings relating to the embodiments described above are schematic, and the dimensional ratios and the like of the respective components do not always match the actual ones. Further, it is needless to say that the dimensional relationships and ratios may differ between the drawings.

Note that the present technology may also be embodied in the configurations described below.

(1) A photoelectric conversion element including:
an on-chip lens that condenses incident light;
a substrate in which a photoelectric conversion unit that performs photoelectric conversion on the condensed incident light is disposed, a back surface side of the substrate being irradiated with the condensed incident light;
a front-surface-side reflective film that is disposed on a front surface side of the substrate and reflects transmitted light, the front surface side being a different side from the back surface side of the substrate, the transmitted light being the incident light having passed through the photoelectric conversion unit; and
a back-surface-side reflective film that is disposed on the back surface side of the substrate, has an opening of substantially the same size as a condensing size of the condensed incident light, and further reflects the reflected transmitted light.

(2) The photoelectric conversion element according to (1), in which, in the back-surface-side reflective film, an opening area of the opening on a side of the on-chip lens differs from an opening area of the opening on a side of the substrate.

(3) The photoelectric conversion element according to (2), in which the back-surface-side reflective film has the opening formed in a tapered shape.

(4) The photoelectric conversion element according to any one of (1) to (3), further including a substrate-back-surface scattering portion that is formed in a back surface of the substrate and scatters the condensed incident light.

(5) The photoelectric conversion element according to (4), in which the substrate-back-surface scattering portion is formed with irregularities formed near the opening of the back-surface-side reflective film.

(6) The photoelectric conversion element according to any one of (1) to (5), further including a substrate reflective portion that is formed in a back surface of the substrate near an edge of the back-surface-side reflective film in the opening and reflects the reflected transmitted light.

(7) The photoelectric conversion element according to (6), in which the substrate reflective portion is formed with a groove formed in the back surface of the substrate.

(8) The photoelectric conversion element according to (6), in which the substrate reflective portion is formed with metal buried in a groove formed in the back surface of the substrate.

(9) The photoelectric conversion element according to any one of (1) to (8), further including a substrate-front-surface scattering portion that is formed near the front surface side of the substrate and scatters the reflected transmitted light.

(10) The photoelectric conversion element according to (9), in which the substrate-front-surface scattering portion is formed in the front-surface-side reflective film.

(11) The photoelectric conversion element according to (10), in which the substrate-front-surface scattering portion is formed with irregularities formed in the front-surface-side reflective film.

(12) The photoelectric conversion element according to (9), in which the substrate-front-surface scattering portion is formed in a front surface of the substrate.

(13) The photoelectric conversion element according to (12), in which the substrate-front-surface scattering portion is formed with irregularities formed in the front surface of the substrate.

(14) The photoelectric conversion element according to any one of (1) to (13), in which the front-surface-side reflective film is formed at the same time as a wiring line that transmits a signal of the photoelectric conversion unit.

(15) The photoelectric conversion element according to any one of (1) to (13), in which the front-surface-side reflective film is formed with an electrode that applies a signal to the photoelectric conversion unit.

(16) The photoelectric conversion element according to any one of (1) to (15), in which the front-surface-side reflective film includes a reflection adjustment portion that adjusts reflection of the transmitted light.

(17) The photoelectric conversion element according to (16), in which the reflection adjustment portion is formed with an opening formed in the front-surface-side reflective film.

(18) The photoelectric conversion element according to (16), in which the reflection adjustment portion is formed with a thin film portion formed in the front-surface-side reflective film.

(19) The photoelectric conversion element according to any one of (1) to (18), further including a plurality of pixels each including the on-chip lens, the substrate, the front-surface-side reflective film, and the back-surface-side reflective film.

(20) The photoelectric conversion element according to (19), in which the pixel further includes a color filter that transmits incident light of a predetermined wavelength in the incident light.

(21) The photoelectric element according to (20), in which the color filter transmits the incident light of a long wavelength.

(22) The imaging device according to (19), in which the back-surface-side reflective film is designed to have a position of the opening shifted in accordance with an incident angle of the incident light entering the pixel.

(23) The imaging device according to (19), in which the back-surface-side reflective film has a shape in which the opening is extended in accordance with an incident angle of the incident light entering the pixel.

(24) The photoelectric conversion element according to any one of (1) to (23), further including an absorption film that is disposed between the on-chip lens and the back-surface-side reflective film and absorbs the reflected transmitted light.

(25) The photoelectric conversion element according to any one of (1) to (24), in which
the substrate is formed with a semiconductor substrate, and
the photoelectric conversion unit is formed with a semiconductor element.

(26) The photoelectric conversion element according to any one of (1) to (24), in which the photoelectric conversion unit is formed with an organic photoelectric conversion film.

(27) A photoelectric conversion device including:
an on-chip lens that condenses incident light;
a substrate in which a photoelectric conversion unit that performs photoelectric conversion on the condensed incident light is disposed, a back surface side of the substrate being irradiated with the condensed incident light;
a front-surface-side reflective film that is disposed on a front surface side of the substrate and reflects transmitted light, the front surface side being a different side from the back surface side of the substrate, the transmitted light being the incident light having passed through the photoelectric conversion unit;
a back-surface-side reflective film that is disposed on the back surface side of the substrate, has an opening of substantially the same size as a condensing size of the condensed incident light, and further reflects the reflected transmitted light; and
a processing circuit that processes a signal generated by the photoelectric conversion unit.

REFERENCE SIGNS LIST

1 Imaging device
10 Pixel array unit
30 Column signal processing unit
100, 200 Pixel
101, 191 Semiconductor substrate
102, 193, 194 Semiconductor region
104 to 108 Substrate reflective portion
109 Substrate-back-surface scattering portion
110 Wiring region
111 Insulating layer
112 Wiring layer
113, 114 Electrode
115 Glass substrate
120, 127 Front-surface-side reflective film
121, 123 Substrate-front-surface scattering portion 122 Wall portion
124 Slit
125, 126 Reflection adjustment portion
128 Waveguide
130 Separation region
140 to 145 Back-surface-side reflective film
146 to 149, 159, 449 Opening
150 Absorption film
160 Protective film
170 Color filter
171 Infrared light blocking filter
180 On-chip lens
192, 195 Contact region
197, 199 Transparent electrode
198 Organic photoelectric conversion film
1000 Camera
1002 Imaging device
1005 Image processing unit

The invention claimed is:

1. A photoelectric conversion element, comprising:
an on-chip lens configured to condense a first incident light;
a substrate,
wherein a back-surface-side of the substrate is irradiated with the condensed first incident light;
a photoelectric conversion unit on the back-surface-side of the substrate, wherein the photoelectric conversion unit is configured to photoelectrically convert the condensed first incident light;
a front-surface-side reflective film on a front surface side of the substrate, wherein the front-surface-side reflective film is configured to reflect transmitted light, the front-surface-side of the substrate is different from the back-surface-side of the substrate,
and the transmitted light is the first incident light passed through the photoelectric conversion unit; and
a back-surface-side reflective film on the back-surface-side of the substrate, wherein the back-surface-side reflective film is configured to reflect the reflected transmitted light, and
the back-surface-side reflective film has a first opening of a size equal to a condensing size of the condensed first incident light.

2. The photoelectric conversion element according to claim 1, wherein, in the back-surface-side reflective film, a first opening area of a second opening on a first side of the on-chip lens differs from a second opening area of a third opening on a second side of the substrate.

3. The photoelectric conversion element according to claim 1, wherein the back-surface-side reflective film has the first opening in a tapered shape.

4. The photoelectric conversion element according to claim 1, further comprising a substrate-back-surface scattering portion on the back-surface-side of the substrate, wherein the substrate-back-surface scattering portion is configured to scatter the condensed first incident light.

5. The photoelectric conversion element according to claim 4, wherein the substrate-back-surface scattering portion has irregularities.

6. The photoelectric conversion element according to claim 1, further comprising a substrate reflective portion on the back-surface-side of the substrate, wherein the substrate reflective portion is configured to reflect the reflected transmitted light.

7. The photoelectric conversion element according to claim 6, wherein
the substrate reflective portion comprises a groove, and
the groove is on the back-surface-side of the substrate.

8. The photoelectric conversion element according to claim 6, wherein
the substrate reflective portion comprises a metal buried in a groove, and
the groove is on the back-surface-side of the substrate.

9. The photoelectric conversion element according to claim 1, further comprising a substrate-front-surface scattering portion configured to scatter the reflected transmitted light.

10. The photoelectric conversion element according to claim 9, wherein the substrate-front-surface scattering portion is on the front-surface-side reflective film.

11. The photoelectric conversion element according to claim 10, wherein the substrate-front-surface scattering portion comprises irregularities on the front-surface-side reflective film.

12. The photoelectric conversion element according to claim 9, wherein the substrate-front-surface scattering portion is on the front surface side of the substrate.

13. The photoelectric conversion element according to claim 12, wherein the substrate-front-surface scattering portion comprises irregularities on the front surface side of the substrate.

14. The photoelectric conversion element according to claim 1, further comprising a wiring line configured to transmit a signal of the photoelectric conversion unit to the substrate, wherein formation of the front-surface-side reflective film is at a same time as formation of the wiring line.

15. The photoelectric conversion element according to claim 1, further comprising an electrode on the front-surface-side reflective film, wherein the electrode is configured to apply a signal to the photoelectric conversion unit.

16. The photoelectric conversion element according to claim 1, wherein
the front-surface-side reflective film includes a reflection adjustment portion, and
the reflection adjustment portion is configured to adjust reflection of the transmitted light.

17. The photoelectric conversion element according to claim 16, wherein
the reflection adjustment portion comprises an opening, and
the opening is in the front-surface-side reflective film.

18. The photoelectric conversion element according to claim 16, wherein the reflection adjustment portion comprises a thin film portion in the front-surface-side reflective film.

19. The photoelectric conversion element according to claim 1, further comprising a plurality of pixels, wherein each pixel of the plurality of pixels includes the on-chip lens, the substrate, the front-surface-side reflective film, and the back-surface-side reflective film.

20. The photoelectric conversion element according to claim 19, wherein
the each pixel of the plurality of pixels further includes a color filter,
the color filter is configured to transmit a second incident light of a specific wavelength, and
the second incident light is a part of the first incident light.

21. The photoelectric conversion element according to claim 20, wherein the color filter is further configured to transmit red light, blue light, and green light.

22. The photoelectric conversion element according to claim 19, wherein
a shift in a position of the first opening is based on an incident angle of the first incident light, and
the first incident light enters a pixel of the plurality of pixels.

23. The photoelectric conversion element according to claim 19, wherein
The back-surface-side reflective film has a shape in which the first opening is extendable based on an incident angle of the first incident light, and
the first incident light enters a pixel of the plurality of pixels.

24. The photoelectric conversion element according to claim 1,
further comprising an absorption film between the on-chip lens and the back-surface-side reflective film, wherein the absorption film is configured to absorb the reflected transmitted light.

25. The photoelectric conversion element according to claim 1, wherein
the substrate is a semiconductor substrate, and
the photoelectric conversion unit is a semiconductor element.

26. The photoelectric conversion element according to claim 1, wherein the photoelectric conversion unit comprises an organic photoelectric conversion film.

27. A photoelectric conversion device, comprising:
an on-chip lens configured to condense incident light;
a substrate,
wherein a back-surface-side of the substrate is irradiated with the condensed incident light;
a photoelectric conversion unit on the back-surface-side of the substrate,
wherein the photoelectric conversion unit is configured to:
photoelectrically convert the condensed incident light; and
generate an image signal of the condensed incident light;
a front-surface-side reflective film, on a front-surface-side of the substrate, configured to reflect transmitted light, wherein the front-surface-side of the substrate is different from the back-surface-side of the substrate, and the transmitted light is the incident light passed through the photoelectric conversion unit;
a back-surface-side reflective film on the back-surface-side of the substrate, wherein
the back-surface-side reflective film is configured to reflect the reflected transmitted light,
the back-surface-side reflective film has an opening of a size equal to a condensing size of the condensed incident light; and
a processing circuit configured to process the generated image signal.

* * * * *